(12) United States Patent
Iwanaga et al.

(10) Patent No.: US 12,243,213 B2
(45) Date of Patent: Mar. 4, 2025

(54) SUBSTRATE INSPECTION DEVICE, SUBSTRATE INSPECTION SYSTEM, AND SUBSTRATE INSPECTION METHOD

(71) Applicant: TOKYO ELECTRON LIMITED, Tokyo (JP)

(72) Inventors: Shuji Iwanaga, Sapporo (JP); Tadashi Nishiyama, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 318 days.

(21) Appl. No.: 17/615,442

(22) PCT Filed: May 28, 2020

(86) PCT No.: PCT/JP2020/021160
§ 371 (c)(1),
(2) Date: Nov. 30, 2021

(87) PCT Pub. No.: WO2020/246366
PCT Pub. Date: Dec. 10, 2020

(65) Prior Publication Data
US 2022/0237770 A1    Jul. 28, 2022

(30) Foreign Application Priority Data

Jun. 6, 2019   (JP) ................................. 2019-106292
Apr. 17, 2020  (JP) ................................. 2020-074213

(51) Int. Cl.
*G06T 7/00*          (2017.01)
(52) U.S. Cl.
CPC .. *G06T 7/0004* (2013.01); *G06T 2207/20084* (2013.01); *G06T 2207/30148* (2013.01)

(58) Field of Classification Search
CPC ........... G01N 21/956; G01N 21/95607; G01N 21/9501; G01N 2021/95615; G01N 21/01;
(Continued)

(56) References Cited

U.S. PATENT DOCUMENTS

2010/0128969 A1*  5/2010  Cao ..................... G03F 7/70675
                                                    382/144
2017/0191948 A1*  7/2017  Gao ................. G01N 21/95607
(Continued)

FOREIGN PATENT DOCUMENTS

JP         2016-212008 A      12/2016

OTHER PUBLICATIONS

Ye, Wei, et al. "LithoGAN: End-to-end lithography modeling with generative adversarial networks." Proceedings of the 56th Annual Design Automation Conference 2019. 2019. (Year: 2019).*

*Primary Examiner* — Emily C Terrell
*Assistant Examiner* — Stefano Anthony Dardano
(74) *Attorney, Agent, or Firm* — Nath, Goldberg & Meyer; Jerald L. Meyer; Tanya E. Harkins

(57) ABSTRACT

A substrate inspection apparatus for inspecting a substrate, includes: an acquisition part configured to acquire an estimated image of an inspection target substrate after a process by a substrate processing apparatus, based on an image estimation model created by a machine learning by using a captured image before the process by the substrate processing apparatus and a captured image after the process by the substrate processing apparatus for each of a plurality of substrates, and a captured image of the inspection target substrate before the process by the substrate processing apparatus; and a determination part configured to determine the presence or absence of a defect in the inspection target substrate, based on a captured image of the inspection target (Continued)

substrate and the estimated image of the inspection target substrate after the process by the substrate processing apparatus.

15 Claims, 17 Drawing Sheets

(58) Field of Classification Search
CPC ...... G01N 21/8851; G06T 2207/30148; G06T 7/0004; G06T 7/0002; G06T 7/00; G06T 7/001; G06T 2207/10024; G06T 2207/20076; G06T 7/0006; G06T 7/0008; G06T 2207/10004; G06T 2207/20081; G06T 2207/20084; H01L 22/12; H01L 21/67288; G03F 7/7065; G03F 7/20; G06V 10/751; G06N 20/00
See application file for complete search history.

(56) References Cited

U.S. PATENT DOCUMENTS

| | | | |
|---|---|---|---|
| 2019/0228522 A1* | 7/2019 | Shinoda | G06T 7/001 |
| 2021/0209413 A1* | 7/2021 | Nakago | H01L 21/3065 |

* cited by examiner

SUBSTRATE INSPECTION DEVICE, SUBSTRATE INSPECTION SYSTEM, AND SUBSTRATE INSPECTION METHOD

This is a National Phase Application filed under 35 U.S.C. 371 as a national stage of PCT/JP2020/021160, filed May 28, 2020, an application claiming the benefit of Japanese Application No. 2019-106292, filed Jun. 6, 2019 and Japanese Application No. 2020-074213, filed Apr. 17, 2020, the content of each of which is hereby incorporated by reference in its entirety.

TECHNICAL FIELD

The present disclosure relates to a substrate inspection apparatus, a substrate inspection system, and a substrate inspection method.

BACKGROUND

Patent Document 1 discloses a wafer inspection method in a substrate processing system including a plurality of processing apparatuses for processing a wafer. In this wafer inspection method, an image of the surface of the wafer before being processed by the processing apparatus is captured to acquire a first substrate image, and a feature amount is extracted from the first substrate image. Subsequently, a reference image corresponding to the feature amount extracted from the first substrate image is selected from a storage part in which a plurality of reference images, which are set corresponding to the feature amounts in different ranges and are used as references for defect inspection, are stored. Then, an image of the surface of the substrate after being processed by the processing apparatus is captured to acquire a second substrate image, and the presence or absence of a defect in the wafer is determined based on the selected reference image and the second substrate image.

PRIOR ART DOCUMENT

Patent Document

Patent Document 1: Japanese Laid-Open Patent Publication No. 2016-212008

The present disclosure provides some embodiments of a technique capable of further improving a defect detection accuracy in defect inspection based on an image obtained by capturing an inspection target substrate.

SUMMARY

According to one embodiment of the present disclosure, there is provided a substrate inspection apparatus for inspecting a substrate, including: an acquisition part configured to acquire an estimated image of an inspection target substrate after a process by a substrate processing apparatus, based on an image estimation model created by machine learning by using a captured image before the process by the substrate processing apparatus and a captured image after the process by the substrate processing apparatus for each of a plurality of substrates, and a captured image of the inspection target substrate before the process by the substrate processing apparatus; and a determination part configured to determine whether or not a defect is present in the inspection target substrate, based on the captured image of the inspection target substrate and the estimated image of the inspection target substrate after the process by the substrate processing apparatus.

According to the present disclosure, it is possible to further improve a defect detection accuracy in defect inspection based on a captured image of an inspection target substrate.

DETAILED DESCRIPTION

Figure 1:
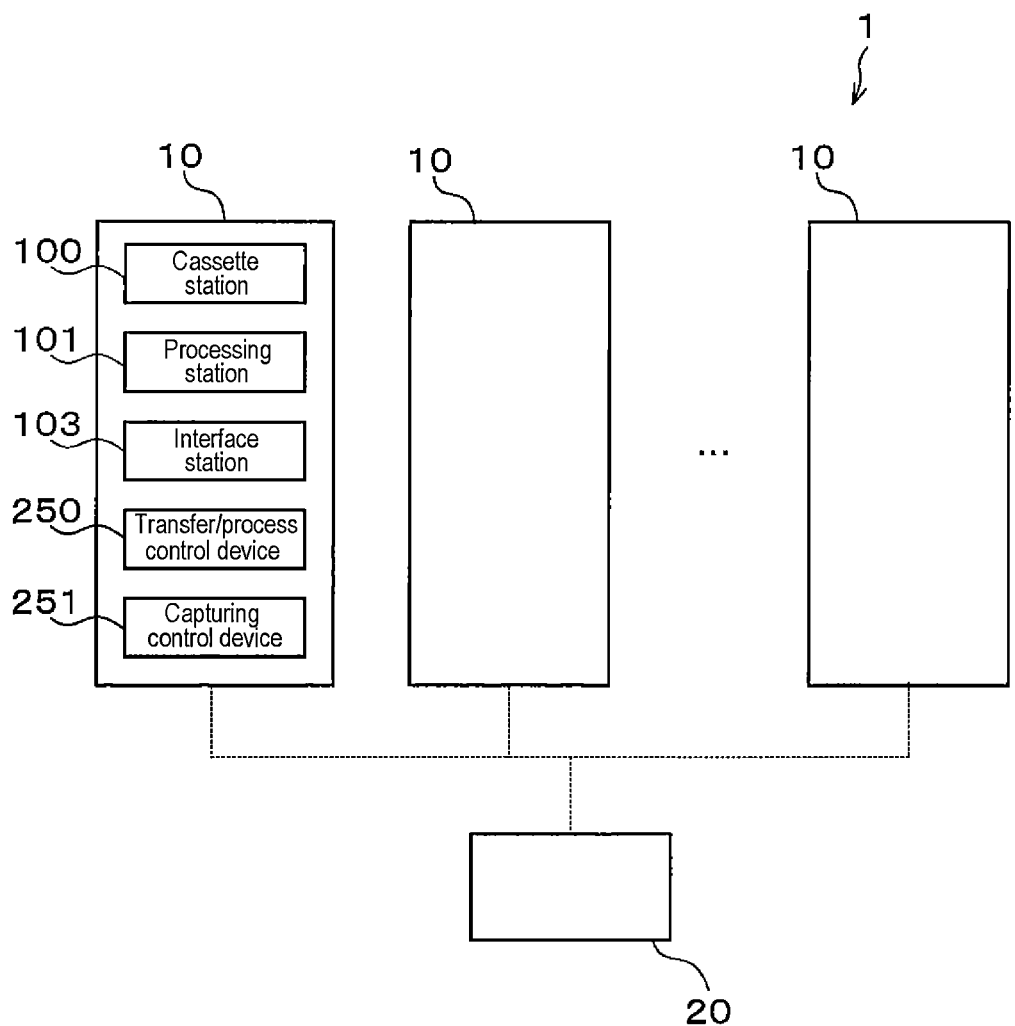
FIG. 1 is a view schematically showing an outline of a configuration of a substrate inspection system according to an embodiment.

In the manufacturing process of a semiconductor devices and the like, a resist coating process of forming a resist film by coating a resist liquid on a semiconductor wafer (hereinafter referred to as a "wafer"), an exposure process of exposing the resist film, a development process of developing the exposed resist film, and the like are sequentially performed to form a resist pattern on the wafer. Then, after the resist pattern is formed, an etching target layer is etched or the like using the resist pattern as a mask to form a predetermined pattern on the etching target layer. When forming the resist pattern, a film other than the resist film may be formed on a lower layer of the resist film.

Further, when forming the resist pattern or when etching using the resist pattern as described above, defect inspection may be performed on the wafer after various processes. In this defect inspection, for example, whether or not the resist pattern is properly formed, whether or not a foreign matter adheres to the wafer, and the like, is inspected. In recent years, an image obtained by capturing the surface of an inspection target wafer after being processed may be used for this defect inspection. In this case, the defect inspection is performed by comparing the captured image of the inspection target wafer with a reference image that serves as an inspection reference.

However, the captured image of the inspection target wafer after being processed is affected by a state of the surface of the inspection target wafer before being processed, that is, a state of a base surface of the inspection target wafer, or the like, which causes unevenness. Further, since the processing environments are non-uniform between wafers, the state of the above-mentioned unevenness may differ for each wafer. For example, even if a resist film is normally formed on an anti-reflection film of the wafer under the same processing conditions, unevenness that occurs in a captured image of the wafer after forming the resist film may differ for each wafer. It is necessary to prevent such an unevenness from erroneously being determined as a defect.

Patent Document 1 discloses selecting a substrate image, which corresponds to the feature amount extracted from the first substrate image acquired by capturing the surface of the wafer before being processed, from substrate images that serve as references for inspection of a plurality of defects, which are set corresponding to different feature amount ranges and stored in the storage part. In Patent Document 1, the presence or absence of defect in the wafer is determined based on the selected substrate image and a second substrate image obtained by capturing the surface of the substrate after being processed.

In the presence of the above-mentioned unevenness, higher defect detection accuracy may be required than that of the defect inspection using the substrate image selected as in Patent Document 1.

Therefore, the technique according to the present disclosure further improves the defect detection accuracy in defect inspection based on a captured image of an inspection target substrate.

Hereinafter, a substrate inspection apparatus, a substrate inspection system, and a substrate inspection method according to an embodiment will be described with reference to the drawings. Throughout the present disclosure and the drawings, elements having substantially the same functional configuration are denoted by the same reference numerals and, therefore, explanation thereof will not be repeated.

FIG. 1 is a diagram schematically showing an outline of a configuration of a substrate inspection system according to an embodiment. As shown in the figure, a substrate inspection system 1 includes a plurality of substrate processing systems 10 and an overall control device 20. The number of substrate processing systems 10 included in the substrate inspection system 1 may be one.

Each substrate processing system 10 processes a wafer as a substrate. In this example, a process of forming a resist pattern on the wafer is performed on the wafer.

Figure 2:
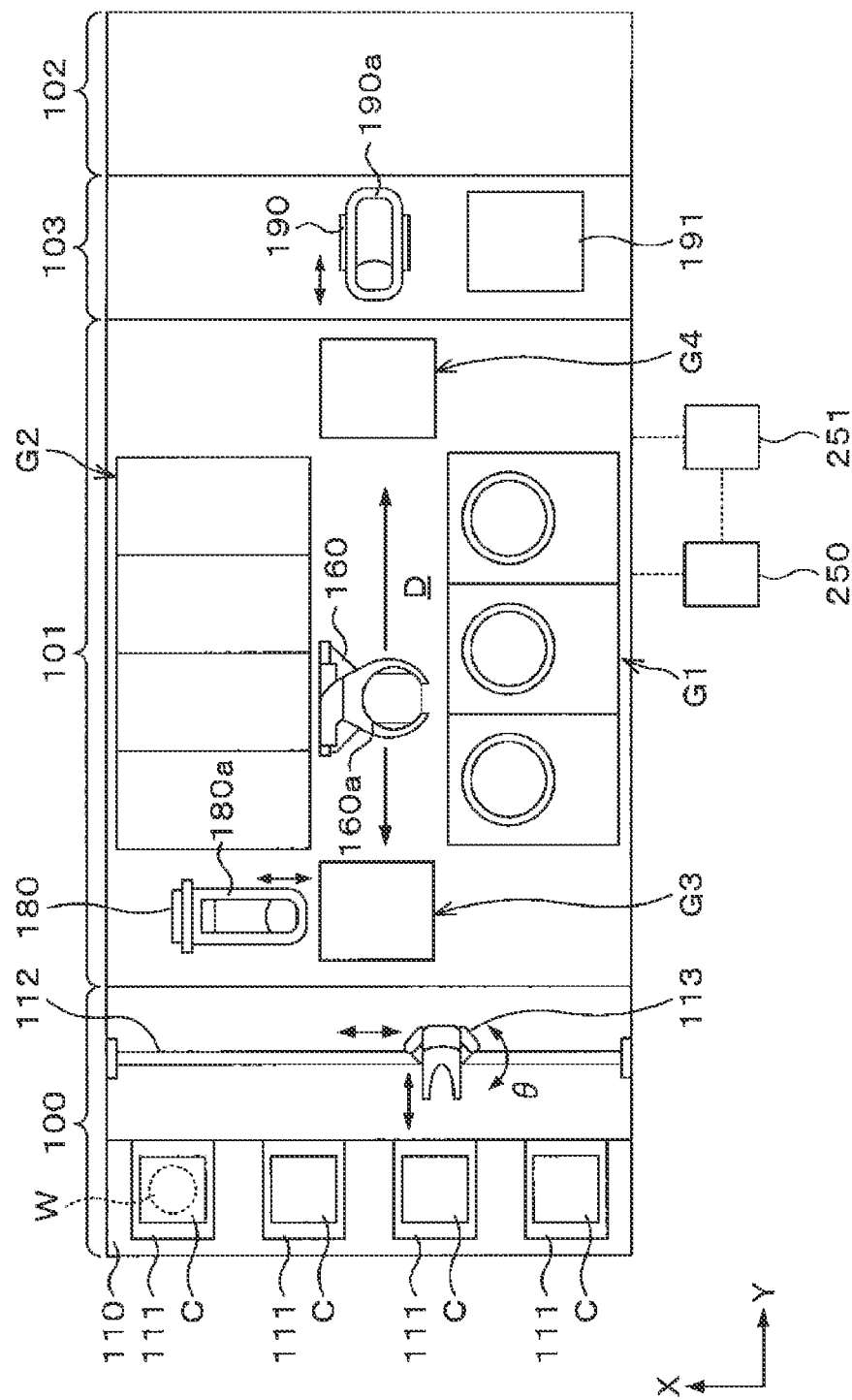
FIG. 2 is a plan view schematically showing an outline of a configuration of each substrate processing system.
Figure 3:
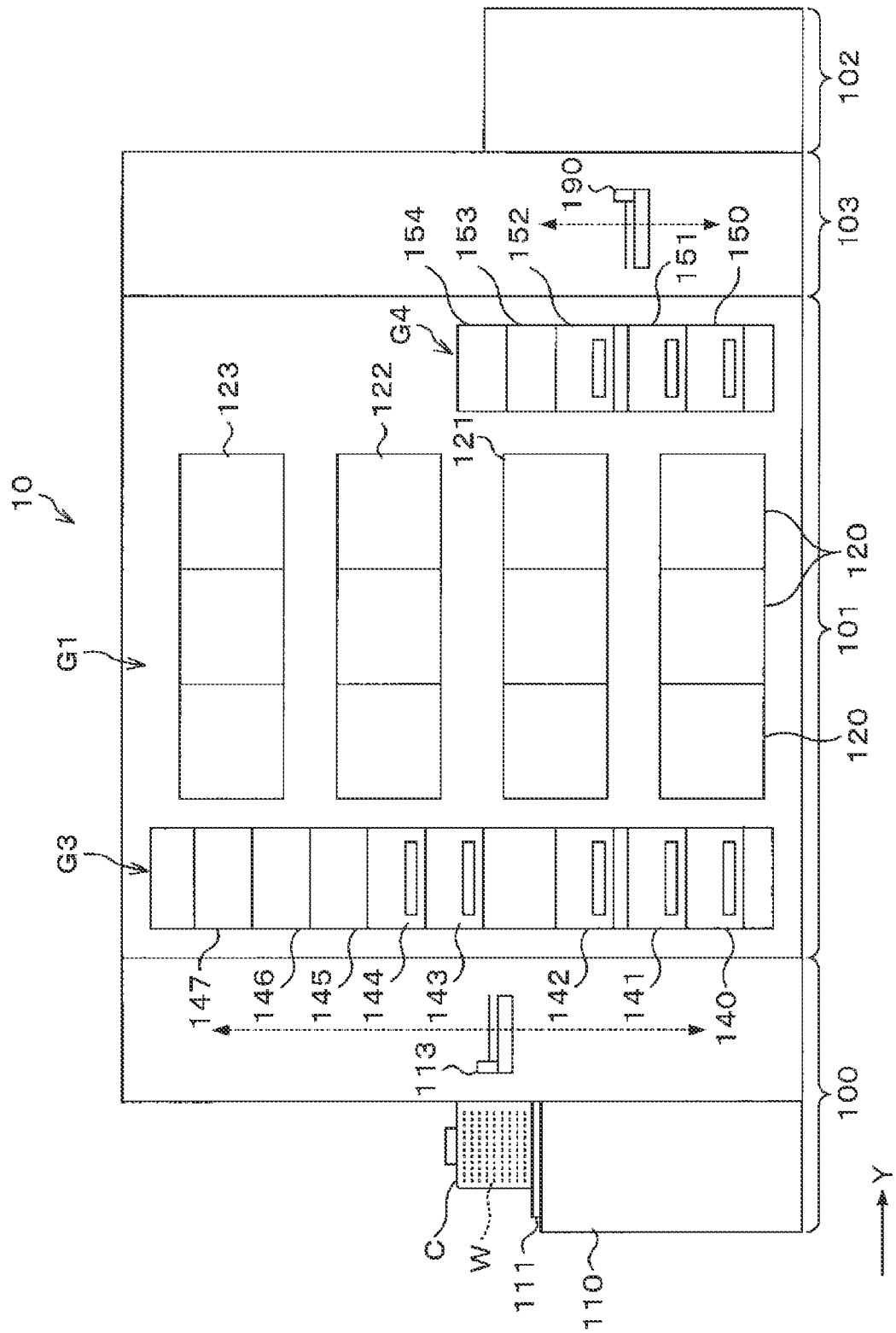
FIG. 3 is a front view schematically showing an outline of an internal configuration of each substrate processing system.
Figure 4:
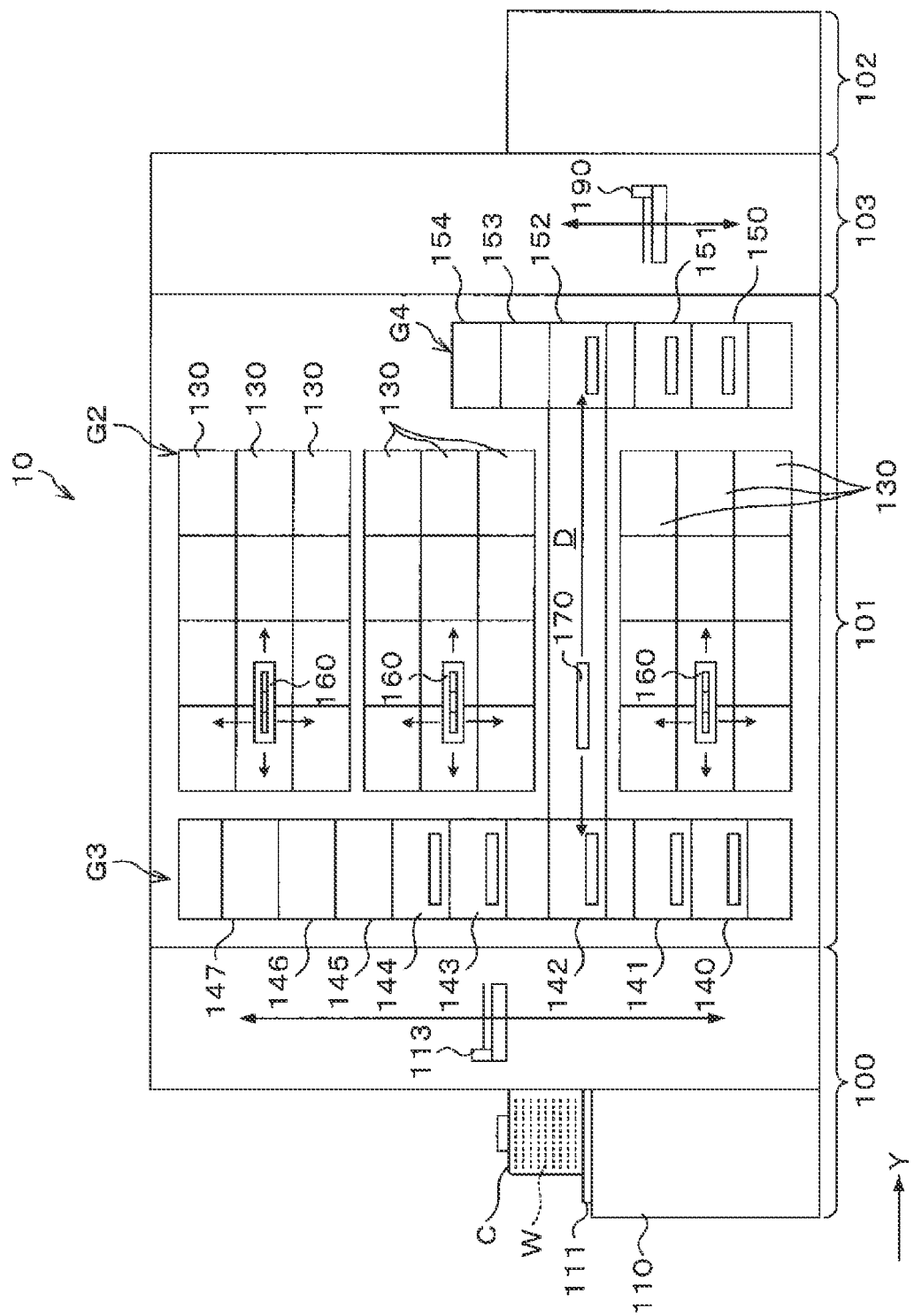
FIG. 4 is a rear view schematically showing an outline of an internal configuration of each substrate processing system.

FIG. 2 is a plan view schematically showing an outline of a configuration of each substrate processing system 10. FIGS. 3 and 4 are a front view and a rear view, respectively, schematically showing an outline of an internal configuration of each substrate processing system 10.

As shown in FIG. 2, each substrate processing system 10 includes a cassette station 100 into and from which a cassette C accommodating a plurality of wafers W is loaded and unloaded, and a processing station 101 including a plurality of processing apparatuses for performing predetermined processes on the wafer W. Each substrate processing system 10 has a configuration in which the cassette station 100, the processing station 101, and an interface station 103 that delivers the wafer W to and from an exposure apparatus 102 adjacent to the processing station 101 are connected integrally with one another.

The cassette station 100 is provided with a cassette stage 110. The cassette stage 110 is provided with a plurality of cassette placement plates 111 on which the cassette C is placed when the cassette C is loaded into and unloaded from the outside of the substrate processing system 10.

The cassette station 100 is provided with a wafer transfer device 113 that is movable along a transfer path 112 extending in an X direction. The wafer transfer device 113 is also movable in a vertical direction and rotatable around a vertical axis (θ direction) so that the wafer W can be transferred between the cassette C on each cassette placement plate 111 and a delivery device of a third block G3 of the processing station 101, which will be described later.

The processing station 101 is provided with a plurality of (for example, four) blocks equipped with various devices, that is, a first block G1 to a fourth block G4. For example, the first block G1 is provided on the front side of the processing station 101 (the negative direction side in the X direction in FIG. 2), and the second block G2 is provided on the back side of the processing station 101 (the positive direction side in the X direction in FIG. 2, the upper side in the figure). The third block G3 is provided on the side of the cassette station 100 of the processing station 101 (the negative direction side in a Y direction in FIG. 2), and the fourth block G4 is provided on the side of the interface station 103 of the processing station 101 (the positive direction side in the Y direction in FIG. 2).

Liquid processing apparatuses, which are substrate processing apparatuses for processing the wafer W using a processing liquid, are arranged in the first block G1. Specifically, as the liquid processing apparatuses, for example, a development processing apparatus 120, an underlayer film forming apparatus 121, an intermediate layer film forming apparatus 122, and a resist coating apparatus 123 are arranged in the first block G1 in this order from below, as shown in FIG. 3.

The development processing apparatus 120 develops the wafer W. Specifically, the development processing apparatus 120 supplies a developing solution onto a resist film of the wafer W to form a resist pattern.

The underlayer film forming apparatus 121 forms an underlayer film which is a base film of the resist film of the wafer W. Specifically, the underlayer film forming apparatus 121 coats an underlayer film material, which is a material for forming the underlayer film, on the wafer W to form the underlayer film. The underlayer film is, for example, an SOC (Spin-On-Carbon) film.

The intermediate layer film forming apparatus 122 forms an intermediate layer film on the underlayer film of the wafer W at a position below the resist film. Specifically, the intermediate layer film forming apparatus 122 coats an intermediate layer film material, which is a material for forming the intermediate layer film, on the underlayer film of the wafer W to form the intermediate layer film. The intermediate layer film is, for example, an SOG (Spin-On-Glass) film.

The resist coating apparatus 123 coats a resist liquid on the wafer W to form a resist film. Specifically, the resist coating apparatus 123 coats the resist liquid on the intermediate layer film of the wafer W to form the resist film.

For example, three development processing apparatuses 120, three underlayer film forming apparatuses 121, three intermediate layer film forming apparatuses 122, and three resist coating apparatuses 123 are arranged side by side in the horizontal direction, respectively. The number and arrangement of the development processing apparatuses 120, the underlayer film forming apparatuses 121, the intermediate layer film forming apparatuses 122, and the resist coating apparatuses 123 may be arbitrarily selected.

In the development processing apparatuses 120, the underlayer film forming apparatuses 121, the intermediate layer film forming apparatuses 122, and the resist coating apparatuses 123, a predetermined processing liquid is coated on the wafer W by, for example, a spin coating method. In the spin coating method, for example, the processing liquid is discharged onto the wafer W from a coating nozzle, and the wafer W is rotated to diffuse the processing liquid on the surface of the wafer W.

Heat treatment apparatuses 130, which are substrate processing apparatus for performing heat treatment such as heating and cooling the wafer W by using a hot plate or a cooling plate on which the wafer W is placed, are arranged side by side in the second block G2 in the vertical direction and the horizontal direction. The number and arrangement of heat treatment apparatuses 130 may be arbitrarily selected. Further, known apparatuses may be used for the heat treatment apparatuses 130.

In the third block G3, a plurality of delivery devices 140, 141, 142, 143, and 144 are provided in the named order from the bottom, and inspection imaging devices 145, 146, and 147 are provided in the named order from the bottom. Further, in the fourth block G4, a plurality of delivery devices 150, 151, and 152 are provided in the named order from the bottom, and inspection imaging devices 153 and 154 are provided thereon.

Figure 5:
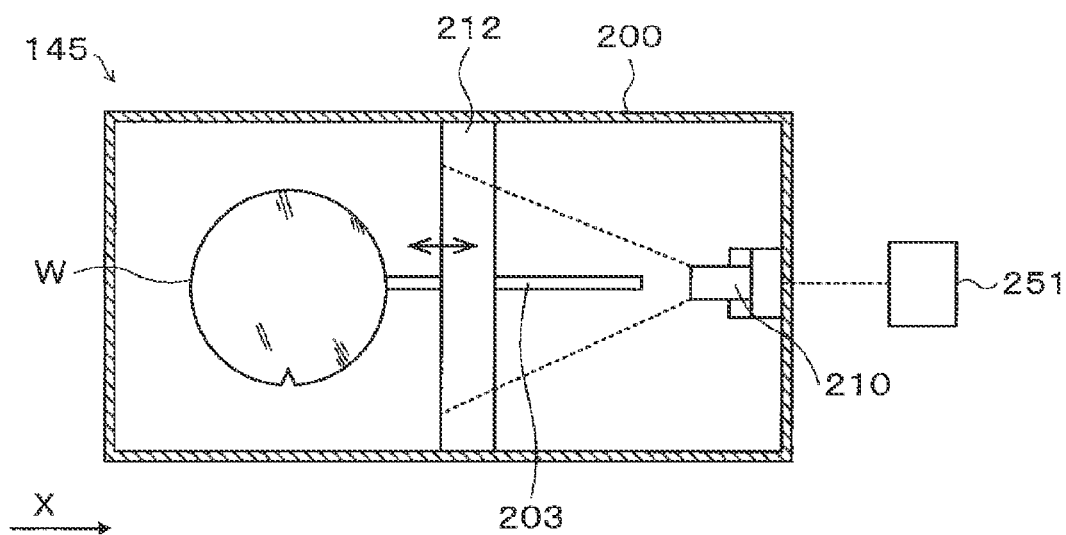
FIG. 5 is a longitudinal cross-sectional view showing an outline of a configuration of an inspection capturing device.
Figure 6:
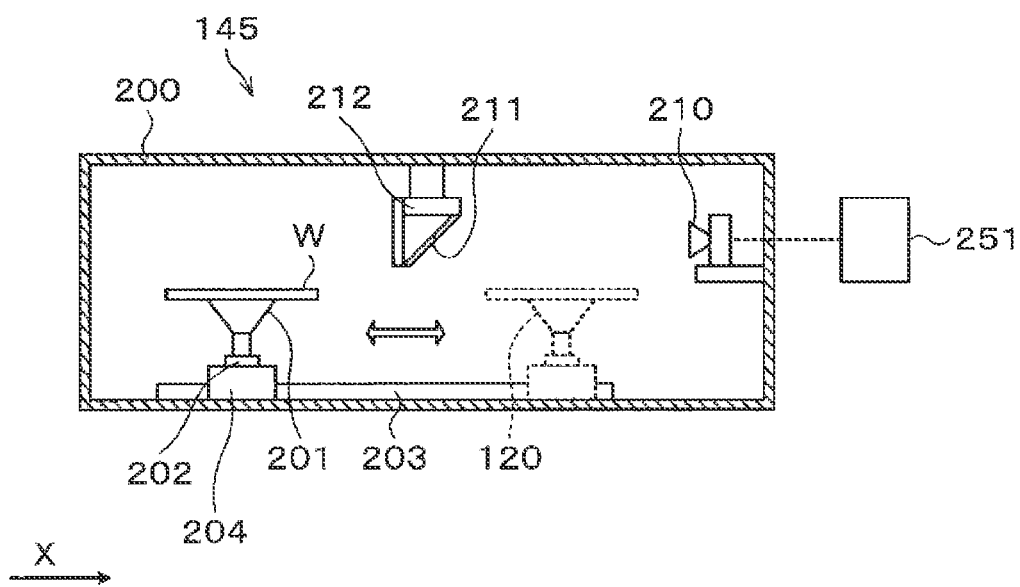
FIG. 6 is a cross-sectional view showing an outline of a configuration of the inspection capturing device.

Now, a configuration of the inspection imaging device 145 will be described. FIGS. 5 and 6 are a longitudinal cross-sectional view and a horizontal cross-sectional view showing an outline of a configuration of the inspection imaging device 145, respectively. The inspection imaging device 145 includes a casing 200 as shown in FIGS. 5 and 6. A stage 201 on which the wafer W is placed is provided inside the casing 200. The stage 201 may be rotated or the rotation thereof may be stopped by a rotary driving part 202 such as a motor. A guide rail 203 extending from one end side (the negative direction side in the X direction in FIG. 6) to the other end side (the positive direction side in the X direction in FIG. 6) inside the casing 200 is provided on the bottom surface of the casing 200. The stage 201 and the rotary driving part 202 are provided on the guide rail 203 and are movable along the guide rail 203 by a driving device 204.

A capturing part 210 is provided on the side surface of the other end side (the positive direction side in the X direction in FIG. 6) in the casing 200. For example, a wide-angle CCD camera is used for the capturing part 210.

A half mirror 211 is provided near the center of the upper portion of the casing 200. The half mirror 211 is provided at a position facing the capturing part 210 in a state in which a mirror surface is inclined upward by 45 degrees toward the capturing part 210 from a state in which the mirror surface faces vertically downward. An illumination device 212 is provided above the half mirror 211. The half mirror 211 and the illumination device 212 are fixed to the upper surface inside the casing 200. The illumination from the illumination device 212 passes through the half mirror 211 and is illuminated downward. Therefore, light reflected by an object below the illumination device 212 is further reflected by the half mirror 211 and is introduced into the capturing part 210. That is, the capturing part 210 can image an object in an irradiation region of the illumination device 212. Then, a captured result by the capturing part 210 is input to a capturing control device 251 to be described later.

The inspection capturing devices 146, 147, 153, and 154 are similar in configuration to the above-described inspection capturing device 145.

Each substrate processing system 10 will be described again with reference to FIGS. 2 to 4. As shown in FIG. 2, a wafer transfer region D is formed in a region surrounded by the first block G1 to the fourth block G4. For example, a plurality of wafer transfer devices 160, each of which has a transfer arm 160a that is movable in the Y direction, the X direction, the θ direction, and the vertical direction, are arranged in the wafer transfer region D. The wafer transfer device 160 is movable in the wafer transfer region D to transfer the wafer W to a desired device in the first block G1, the second block G2, the third block G3, and the fourth block G4 arranged around the wafer transfer device 160.

Further, as shown in FIG. 4, a shuttle transfer device 170 that linearly transfers the wafer W between the third block G3 and the fourth block G4 is provided in the wafer transfer region D.

The shuttle transfer device 170 is linearly movable in the Y direction of FIG. 4, for example. The shuttle transfer device 170 is movable in the Y direction while supporting the wafer W to transfer the wafer W between the delivery device 142 of the third block G3 and the delivery device 152 of the fourth block G4.

As shown in FIG. 2, a wafer transfer device 180 is provided close to the third block G3 on the positive direction side in the X direction. The wafer transfer device 180 includes, for example, a transfer arm 180a that is movable in the X direction, the θ direction, and the vertical direction. The wafer transfer device 180 is movable up and down while supporting the wafer W to transfer the wafer W to each delivery device inside the third block G3.

The interface station 103 is provided with a wafer transfer device 190 and a delivery device 191. The wafer transfer device 190 includes, for example, a transfer arm 190a that is movable in the Y direction, the θ direction, and the vertical direction. For example, the wafer transfer device 190 may support the wafer W with the transfer arm 190a and transfer the wafer W between each transfer device in the fourth block G4, the transfer device 191, and the exposure apparatus 102.

Further, the substrate processing system 10 is provided with a transfer/process control device 250 and a capturing control device 251 as a substrate inspection apparatus.

The transfer/process control device 250 (hereinafter sometimes referred to as a "main control device 250") is a computer equipped with, for example, a CPU, a memory, or the like, and includes a program storage part (not shown). This program storage part stores a program for controlling the operation of drive systems of the above-described various processing apparatuses and transfer devices to perform various processes on the wafer W. The above program may be recorded on a non-transitory computer-readable storage medium and may be installed on the main control device 250 from the storage medium. The program may be partly or entirely implemented by a dedicated hardware (circuit board).

Like the main control device 250, the capturing control device 251 is a computer equipped with, for example, a CPU, a memory, and the like, and includes a program storage part (not shown). This program storage part stores a program for controlling the operation of the capturing part and the drive system of each inspection capturing device to control the processes relating to the substrate inspection. The program may be recorded on a computer-readable storage medium and may be installed on the capturing control device 251 from the storage medium. The program may be partly or entirely implemented by a dedicated hardware (circuit board).

The substrate inspection system 1 will be described again with reference to FIG. 1. As described above, the substrate inspection system 1 includes the overall control device 20. The overall control device 20 is, for example, a computer equipped with a CPU, a memory, or the like, and includes a program storage part (not shown). This program storage part stores a program for creating an image estimation model which will be described later. The program may be recorded on a computer-readable storage medium and may be installed on the overall control device 20 from the storage medium. The program may be partly or entirely implemented by a dedicated hardware (circuit board).

Figure 7:
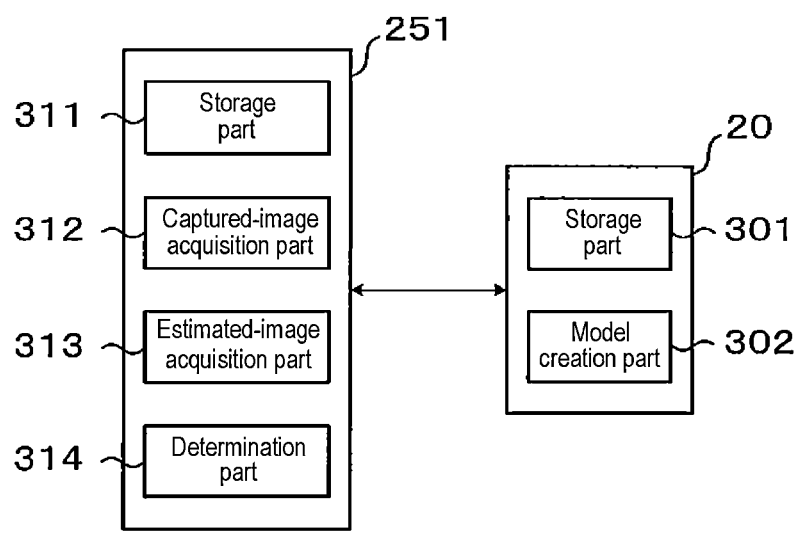
FIG. 7 is a block diagram schematically showing an outline of a configuration relating to substrate inspection in a capturing control device and an overall control device.

FIG. 7 is a block diagram schematically showing an outline of configurations of the capturing control device 251 and the overall control device 20 which are associated with the substrate inspection. As shown in the figure, the overall control device 20 includes a storage part 301 and a model creation part 302.

The storage part 301 stores various types of information. The captured image of the wafer W acquired from the result of capturing the wafer W by the capturing part 210 of the inspection capturing device in each substrate processing system 10 is stored in the storage part 301. In the following, for the purpose of easy understanding, the captured image and an estimated image to be described later are assumed to be grayscale images unless otherwise specified. However, these images may be images of at least one of R component, G component, and B component. Each captured image is associated with identification information about a captured wafer W, identification information about a processing apparatus used for processing the captured wafer W, and the like.

The model creation part 302 uses a captured image before a desired process and a captured image after the desired process in the substrate processing system 10 (hereinafter sometimes referred to as a "captured image set before and after process in the substrate processing system 10") for each of the plurality of wafers W to create an image estimation model by machine learning. The image estimation model is a model that estimates the captured image of the inspection target wafer W after the desired process in the substrate processing system 10 from the captured image of the inspection target wafer W before the desired process in the substrate processing system 10. In other words, the image estimation model is a model that generates an estimated image of the inspection target wafer W after the process from the captured image of the inspection target wafer W before the process.

The machine learning used to create the image estimation model is, for example, machine learning by conditional GANs (Generative Adversarial Networks), more specifically pix2pix. Further, the image estimation model is, for example, a generation network (Generator) that converts an arbitrary input image to generate a fake image in the conditional GAN or pix2pix.

In the conditional GAN or pix2pix, an identification network (discriminator) is used as a neural network in addition to the generation network. The identification network receives an arbitrary image and a real image corresponding to the arbitrary image or a fake image generated by the generation network based on the arbitrary image, and identifies whether an image input together with the arbitrary image is a real image or a fake image. Then, in the machine learning by the conditional GAN or the pix2pix, an identification method is learned for the identification network so that the above identification can be performed accurately, and an image conversion method is learned for the generation network so that a fake image can be recognized as a real image in the identification network.

The model creation part 302 uses the captured image set before and after process in the substrate processing system 10 as an image set of the above-mentioned arbitrary image input to the identification network and the real image corresponding to the arbitrary image. The image estimation model created by the model creation part 302 is sent to the capturing control device 251 of the substrate processing system 10.

The capturing control device 251 includes a storage part 311, a captured-image acquisition part 312, an estimated-image acquisition part 313, and a determination part 314.

The storage part 311 stores various types of information. The storage part 311 stores, for example, the image estimation model created by the model creation part 302 of the overall control device 20.

The captured-image acquisition part 312 acquires the captured image of the wafer W based on the imaging result of the wafer W by the capturing part 210 of each of the inspection capturing devices 145, 146, 147, 153, and 154. Specifically, the captured-image acquisition part 312 performs a necessary image process on the image captured by the capturing part 210, and thereby generates an image showing the state of the entire surface of the wafer W as the captured image of the wafer W. The captured-image acquisition part 312 acquires captured images of the inspection target wafer W before a desired process and after the desired process in the substrate processing system 10, and also acquires captured images of the inspection target wafers W before and after the desired process, which are used to create the image estimation model.

The estimated-image acquisition part 313 generates and acquires an estimated image of the inspection target wafer W after the desired process, based on the captured image of the inspection target wafer W before the desired process in the substrate processing system 10, which is acquired by the captured-image acquisition part 312, and the image estimation model stored in the storage part 311. The overall control device 20 may use the image estimation model to generate the estimated image of the inspection target wafer W after the desired process, and the estimated-image acquisition part 313 may acquire the generated estimated image.

The determination part 314 determines the presence or absence of a defect in the inspection target wafer W, based on the captured image of the inspection target wafer W after the desired process in the substrate processing system 10, which is acquired by the captured-image acquisition part 312. In particular, the determination part 314 determines the presence or absence of a defect in the inspection target wafer W, based on the captured image of the inspection target wafer W after the desired process, which is acquired by the captured-image acquisition part 312, and the estimated image of the inspection target wafer W after the desired process, which is acquired by the estimated-image acquisition part 313. Specifically, the determination part 314 compares the captured image of the inspection target wafer W after the desired process with the estimated image of the inspection target wafer W after the desired process, and determines the presence or absence of a defect in the inspection target wafer W, based on the comparison result. More specifically, the determination part 314 determines the presence or absence of a defect in the inspection target wafer W, based on a difference between the captured image of the inspection target wafer W after the desired process and the estimated image of the inspection target wafer W after the desired process.

Next, a method of processing the wafer W and a method of inspecting the wafer W, which are performed in each substrate processing system 10 configured as described above, will be described. In the following description, an image of the wafer W is captured at three or more timings, but it is assumed that defect inspection based on a captured image of the wafer W is performed only based on a captured image of the wafer W after forming a resist pattern. Further, it is assumed that the machine learning of the image estimation model for the wafer W after forming the resist pattern, which is used for the defect inspection, has been completed prior to the following process on the wafer W and inspection of the wafer W. The image estimation model is created based on, for example, the captured image of the wafer W after forming the resist film (that is, before forming a resist pattern) of the wafer W and a wafer W after forming the resist pattern in each substrate processing system 10.

First, the cassette C accommodating the plurality of wafers W is loaded into the cassette station 100. Then, under the control of the main control device 250, the wafers W in the cassette C are transferred to the inspection capturing device 145 of the third block G3. Then, under the control of the capturing control device 251, an image of each wafer W before forming various films such as an underlayer film, that is, in an initial state, is captured by the capturing part 210, and a captured image of the wafer W in the initial state is acquired by the captured-image acquisition part 312.

Subsequently, under the control of the main control device 250, the wafer W is transferred to the underlayer film forming apparatus 121 of the first block G1 to form an underlayer film on the wafer W. Subsequently, the wafer W is transferred to the heat treatment apparatus 130 for underlayer film in the second block G2 to perform heat-treatment on the underlayer film. After that, the wafer W is transferred to the inspection capturing device 153. Then, under the control of the capturing control device 251, an image of the wafer W after forming the underlayer film is captured by the capturing part 210 to acquire the captured image of the wafer W after forming the underlayer film.

Subsequently, under the control of the main control device 250, the wafer W is transferred to the intermediate layer film forming apparatus 122 of the first block G1 to form an intermediate layer film on the underlayer film of the wafer W. Subsequently, the wafer W is transferred to the heat treatment apparatus 130 for intermediate layer in the second block G2 to perform heat-treatment on the intermediate layer film. After that, the wafer W is transferred to the inspection capturing device 146. Then, under the control of the capturing control device 251, an image of the wafer W after forming the intermediate layer film is captured by the capturing part 210, and the captured image of the wafer W after forming the intermediate layer film is acquired by the captured-image acquisition part 312.

Subsequently, under the control of the main control device 250, the wafer W is transferred to the resist coating apparatus 123 of the first block G1 to form a resist film on the intermediate layer film of the wafer W. Subsequently, the wafer W is transferred to the heat treatment apparatus 130 for PAB process in the second block G2 to perform a PAB process. After that, the wafer W is transferred to the inspection capturing device 153. Then, under the control of the capturing control device 251, an image of the wafer W after forming the resist film is captured by the capturing part 210, and the captured image of the wafer W after forming the resist film is acquired by the captured-image acquisition part 312.

Subsequently, under the control of the main control device 250, the wafer W is transferred to the exposure apparatus 102 where the wafer W is exposed to have a desired pattern. Subsequently, the wafer W is transferred to the heat treatment apparatus 130 for PEB process in the second block G2 to perform a PEB process. Subsequently, the wafer is transferred to the development processing apparatus 120 of the first block G1 to perform a developing process to form a resist pattern on the wafer W. After that, the wafer W is transferred to the inspection capturing device 147. Then, under the control of the capturing control device 251, an image of the wafer W after forming the resist pattern is captured by the capturing part, and the captured image of the wafer W after forming the resist pattern is acquired by the captured-image acquisition part 312.

Subsequently, based on the captured image of the wafer W after forming the resist pattern, which is acquired by the captured-image acquisition part 312, the presence or absence of a defect in the wafer after forming the resist pattern is determined. Specifically, based on the captured image of the wafer W after forming the resist film (that is, before forming the resist pattern) and the image estimation model regarding the wafer W after forming the resist pattern, which is prepared in advance, an estimated image of the wafer W after forming the resist pattern is generated by the estimated-image acquisition part 313. Then, the determination part 314 determines the presence or absence of a defect in the wafer W after forming the resist pattern (that is, the inspection target wafer W), based on the captured image of the wafer W after forming the resist pattern, and the estimated image. In this determination of the presence or absence of a defect, for example, for the wafer W after forming the resist pattern, the captured image and the estimated image are compared, and portions where there is a difference between pixel values of both of the images by a threshold value or more are determined to be defective, and other portions are determined to be not defective.

In the above determination, when the creation of the image estimation model for the wafer W after forming the resist pattern has not been completed, the presence or absence of a defect is determined in the same manner as in the conventional case. Further, when the creation of the image estimation model has not been completed, the captured image of the wafer W after forming the resist film and the captured image of the wafer W after forming the resist pattern are input to the model creation part 302 of the overall control device 20 to advance the machine learning of the above model.

Upon completion of the above determination, that is, upon completion of the defect inspection, the wafer W is returned to the cassette C under the control of the main control device 250, and the processes for the wafer W are completed. Then, the above-described processes are also performed on the other wafers W.

As described above, in the present embodiment, the captured image before the desired process and the captured image after the desired process for each of the plurality of wafers W in the substrate processing system 10 are used and the image estimation model created by the machine learning is used. This image estimation model is a model that creates an estimated image of the wafer W after the desired process from the captured image of the wafer W before the desired process in the substrate processing system 10. In the present embodiment, the estimated image of the inspection target wafer W after the desired process is generated and acquired based on the image estimation model and the captured image of the inspection target wafer W before the desired process. Then, the presence or absence of a defect in the inspection target wafer W is determined based on a captured image actually acquired for the inspection target wafer W after the desired process, and the estimated image. That is, determination of the presence or absence of a defect in the inspection target wafer is performed based on a reference image that is suitable for each inspection target wafer W and serves as a reference for defect inspection. Therefore, the defect detection accuracy can be improved. Specifically, since the reference image used as the reference for defect inspection is an estimated image generated based on the above image estimation model, the captured image and the estimated image, that is, the reference image, for the inspection target wafer W after the desired process have almost the same unevenness. Therefore, since it is unlikely that unevenness is detected as a defect, the defect detection accuracy can be improved. That is, in determining the presence or absence of a defect, when the captured image and the estimated image of the inspection target wafer W after the desired process are compared with each other as described above, since there is no possibility that unevenness is erroneously detected as a defect, the above-mentioned threshold value can be reduced. Therefore, it is possible to detect a defect that cannot be detected when the threshold value is large.

Figure 8A:
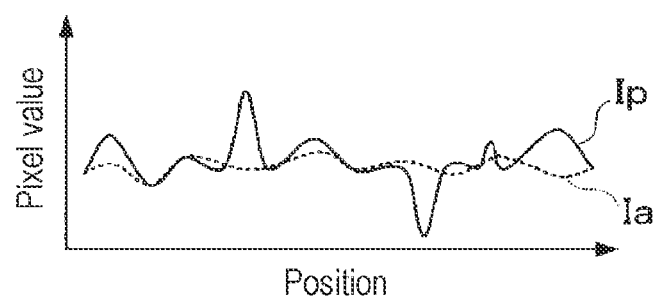
FIGS. 8A to 8C are conceptual views for explaining an example of a conventional defect inspection.
Figure 8B:
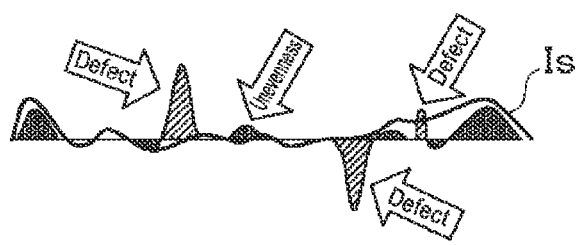
Figure 8C:
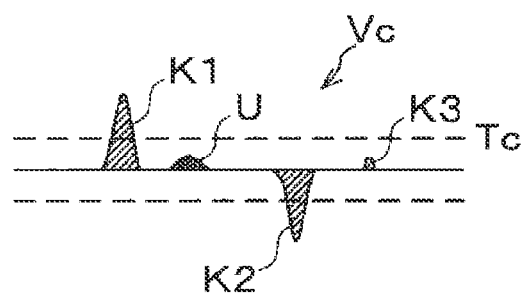
Figure 9A:
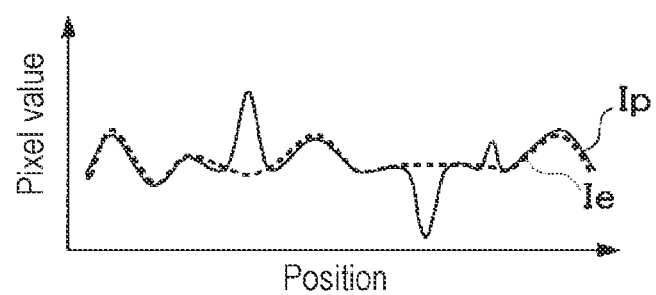
FIGS. 9A and 9B are conceptual views for explaining an example of a defect inspection according to an embodiment.
Figure 9B:
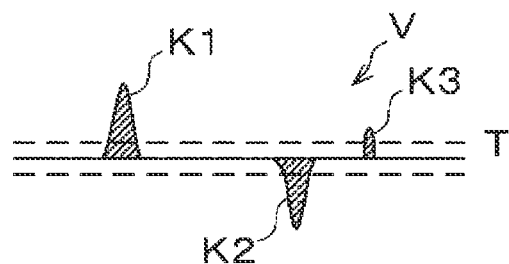

The effects of the defect inspection according to the present embodiment will be described in more detail with reference to FIGS. 8A to 8C and FIGS. 9A and 9B. FIGS. 8A to 8C are conceptual views for explaining an example of a conventional defect inspection. FIGS. 9A and 9B are conceptual views for explaining an example of a defect inspection according to the present embodiment. In FIGS. 8A to 8C and FIGS. 9A and 9B, the horizontal axis represents the coordinate of each portion along a certain direction on the wafer with respect to the direction, and the vertical axis represents a value such as a pixel value of each portion. FIG. 8A shows an example of a relationship between a captured image Ip of the inspection target wafer W and an average image Ia to be described later, FIG. 8B shows a difference between the captured image Ip of the inspection target wafer W and the average image Ia to be described later, and FIG. 8C shows an example of a defect determination value Vc to be described later in the conventional defect inspection. FIG. 9A shows an example of a relationship between the captured image Ip of the inspection target wafer W and the corresponding estimated image Ie, and FIG. 9B shows an example of a defect determination value V to be described later according to the present embodiment.

In the conventional defect inspection, for example, captured images of a plurality of wafers W after a desired process are acquired, and an average image Ia and a standard deviation image Is are acquired from the captured images of the plurality of wafers W. The average image Ia is an image in which the average value of pixels in the captured images of the plurality of wafers W is used as a pixel value of each pixel. For example, the average image Ia has a relationship with the captured image Ip of the inspection target wafer W, as shown in FIG. 8A. Further, the standard deviation image Is is an image in which the standard deviation of pixels in the captured images of the plurality of wafers W is used as the pixel value of each pixel.

Then, in the conventional defect inspection, the difference between the captured image Ip of the inspection target wafer W and the average image Ia is calculated. As shown in FIG. 8B, a portion having a significant value in the above difference has not only a defective portion but also a portion caused by unevenness. Therefore, the standard deviation image Is is applied as a variation filter for removing the unevenness to generate a defect determination value Vc. Specifically, in pixels in which the absolute value of a pixel value of the difference exceeds the absolute value of a pixel value of the standard deviation image Is, the pixel value of the standard deviation image Is is subtracted from the pixel value of the difference for each pixel to generate the defect determination value Vc as shown in FIG. 8C. In the conventional defect inspection, in this defect determination value, a portion exceeding a threshold value Tc is determined to be a defect. However, the standard deviation image Is as the variation filter for removing the unevenness is not unique to each wafer W and does not accurately represent the unevenness. Therefore, as shown in FIG. 8C, the portion having a significant value in the defect determination value has not only a portion caused by defects K1, K2, and K3 but also a portion caused by unevenness U. In order to prevent the portion having the uneven U from being detected as a defect, in the conventional defect inspection method, the threshold value Tc with respect to the defect determination value is set to be large. That is, the detection sensitivity is set to be low. Therefore, there may be a case where only the defects K1 and K2 showing a large value in the defect determination value Vc are detected, but the defect K3 to be detected, showing a small value in the defect determination value Vc, cannot be detected.

In contrast, in the present embodiment, the captured image Ip of the inspection target wafer W after the desired process and the estimated image Ie serving as the reference image for defect inspection have a relationship, for example, as shown in FIG. 9A. Then, for example, a difference in each pixel between the captured image Ip and the estimated image Ie of the inspection target wafer W after the desired process is defined as the defect determination value V, and in this defect determination value V, a portion exceeding a threshold value T is determined to be a defect. The estimated image Ie used for the defect determination of the present embodiment is created based on the image estimation model created by the machine learning as described above, is unique to each wafer W, and reflects the state of the inspection target wafer W before the desired process. Therefore, the unevenness is substantially the same between the captured image Ip and the estimated image Le of the inspection target wafer W after the desired process. As shown in FIG. 9B, a portion showing a significant value in the defect determination value V does not have a portion caused by unevenness, but has only a portion caused by the defects K1, K2, and K3. Therefore, even if the threshold value T with respect to the defect determination value V is set to be small, the uneven portion is not detected as a defect. Therefore, by setting the threshold value T to be small, that is, by setting the detection sensitivity to be high, it is possible to accurately detect the defect K3 showing a small value in the defect determination value V.

Figure 10:
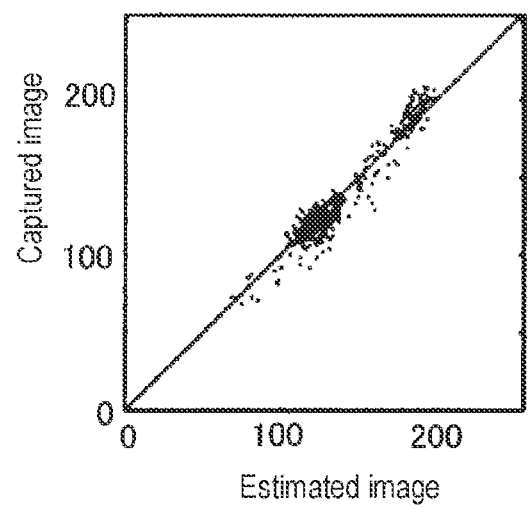
FIG. 10 is a view showing a relationship between a pixel value of an actual captured image and a pixel value of an estimated image for each portion of the images, and shows the entire wafer.
Figure 11:
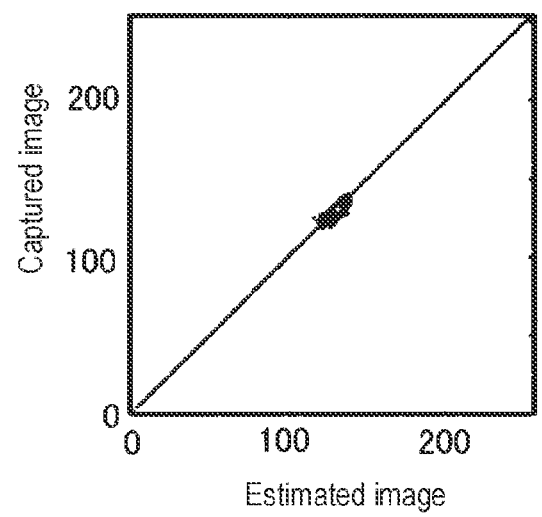
FIG. 11 is a view showing the relationship between the pixel value of the actual captured image and the pixel value of the estimated image for each portion of the images, and shows only a central portion of the wafer.

The present inventors actually created an image estimation model by machine learning by using the captured image of the wafer W after forming the resist film and the captured image of the wafer W after forming the resist pattern. Then, an estimated image after forming a resist pattern of an inspection target wafer W was generated from the captured image of the inspection target wafer W after forming the resist film, and the created image estimation model, and was compared with the actual captured image of the inspection target wafer W after forming the resist pattern. The results are shown in FIGS. 10 and 11. FIGS. 10 and 11 are views showing a relationship between a pixel value of the actual captured image and a pixel value of the estimated image for each portion of the image. FIG. 10 shows the entire wafer, and FIG. 11 shows only a central portion of the wafer. As shown in FIGS. 10 and 11, in each portion of the image, the pixel value of the actual captured image and the pixel value of the estimated image showed close values. In particular, as shown in FIG. 11, in the central portion of the wafer, the pixel value of the actual captured image and the pixel value of the estimated image are substantially the same. Although FIGS. 10 and 11 are for the pixel value of the R component, it has been confirmed by the present inventors that the G component and the B component also show the same tendency as the R component.

In the above description, the image estimation model for the inspection target wafer W after forming the resist pattern is created based on the captured image of the wafer W after forming the resist film, and the captured image of the wafer W after forming the resist pattern. Instead of this, the image estimation model for the inspection target wafer W after forming the resist pattern may be created based on the captured image of the wafer W in the initial state before forming the underlayer film, and the captured image of the wafer W after forming the resist pattern. Then, an estimated image of the inspection target wafer W after forming the resist pattern may be estimated based on the image estimation model and the captured image of the inspection target wafer W in the initial state, and the defect inspection of the inspection target wafer W after forming the resist pattern may be performed based on this estimated image.

Figure 12:
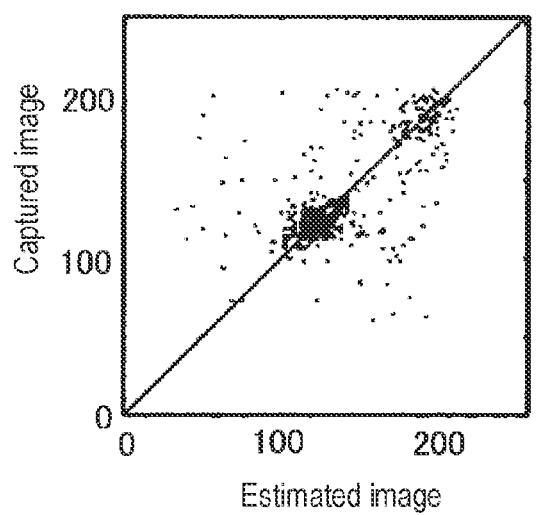
FIG. 12 is a view showing a relationship between the pixel value of the actual captured image and a pixel value of another estimated image for each portion of the images, and shows the entire wafer.
Figure 13:
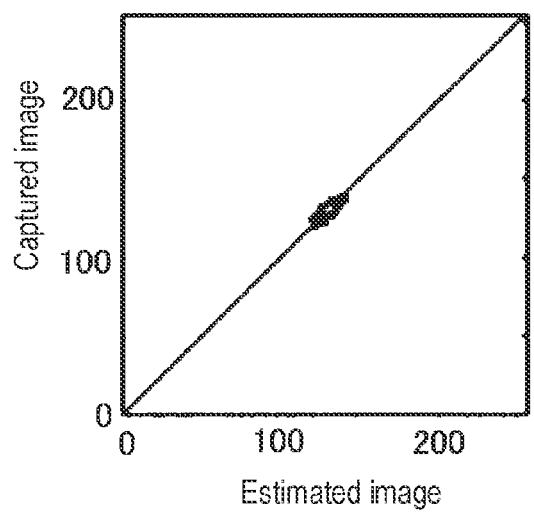
FIG. 13 is a view showing a relationship between a pixel value of an actual captured image and a pixel value of another estimated image for each portion of the image, and shows only the central portion of the wafer.

The present inventors actually created an image estimation model by machine learning by using the captured image of the wafer W in the initial state and the captured image of the wafer W after forming the resist pattern. Then, an estimated image after forming a resist pattern of an inspection target wafer W was generated from the captured image of the inspection target wafer W in the initial state, and the created image estimation model, and was compared with the actual captured image of the inspection target wafer W after forming the resist pattern. The results are shown in FIGS. 12 and 13. FIGS. 12 and 13 are views showing a relationship between a pixel value of the actual captured image and a pixel value of the estimated image for each portion of the image. FIG. 12 shows the entire wafer, and FIG. 13 shows only a central portion of the wafer. As shown in FIGS. 12 and 13, in each portion of the image, the pixel value of the actual captured image and the pixel value of the estimated image showed close values. In particular, as shown in FIG. 13, in the central portion of the wafer, the pixel value of the actual captured image and the pixel value of the estimated image are substantially the same. Although FIGS. 12 and 13 are for the pixel value of the R component, it has been confirmed by the present inventors that the G component and the B component also show the same tendency as the R component.

Further, the image estimation model for the inspection target wafer W after forming the resist pattern may be created based on the captured image of the wafer W after forming the underlayer film or the captured image of the wafer W after forming the intermediate layer film, and the captured image of the wafer W after forming the resist pattern. Then, an estimated image of the inspection target wafer W after forming the resist pattern may be estimated based on the image estimation model and the captured image of the inspection target wafer W after forming the underlayer film or the wafer after forming the intermediate layer film, and the defect inspection of the inspection target wafer W after forming the resist pattern may be performed based on this estimated image. That is, when n types of processes are performed and captured images of the inspection target wafer W are acquired before and after each type of processes, the following captured images may be used for defect inspection and generation of the image estimation model for the inspection target wafer W after an m(m≤n)-th type of process. That is, not only a captured image of the wafer W immediately before the m-th type of process (in other words, after an (m−1)-th type of process) but also a captured image of the wafer W immediately before the (m−1)-type of process (in other words, after an (m−2)-th type of process) may be used.

Further, in the present embodiment, based on the results of FIGS. 11 and 13, the defect inspection may be performed based on an image of only the central portion of the wafer in the captured image and the estimated image of the inspection target wafer W after the desired process in the substrate processing system 10. As a result, the possibility of erroneous detection of unevenness as a defect can be further reduced, so that the defect detection can be performed more accurately. In this case, for example, an edge filter that excludes the peripheral edge of the wafer W is applied in the defect inspection.

Further, for example, captured images acquired by a plurality of substrate processing systems 10 of the substrate inspection system 1 are used to create an image estimation model common between the substrate processing systems. Instead of this, the image estimation model for a certain substrate processing system 10 may be created by using only the captured image acquired by the substrate processing system. This makes it possible to create an image estimation model that reflects the characteristics of the substrate processing system 10.

Further, a captured image of the wafer W determined to have a defect in the defect inspection may be removed from the captured images of the wafer W used for creating the image estimation model. This makes it possible to create a more accurate image estimation model.

Further, in the substrate processing system 10, a plurality of types of film-forming processes (including a resist pattern-forming process after a resist film-forming process) are performed, but the substrate inspection method according to the present embodiment may also be applied to a case where a single film-forming process is performed. Further, the substrate inspection method according to the present embodiment may also be applied to a case where a process (for example, an etching process) other than the film-forming process is performed.

Figure 14:
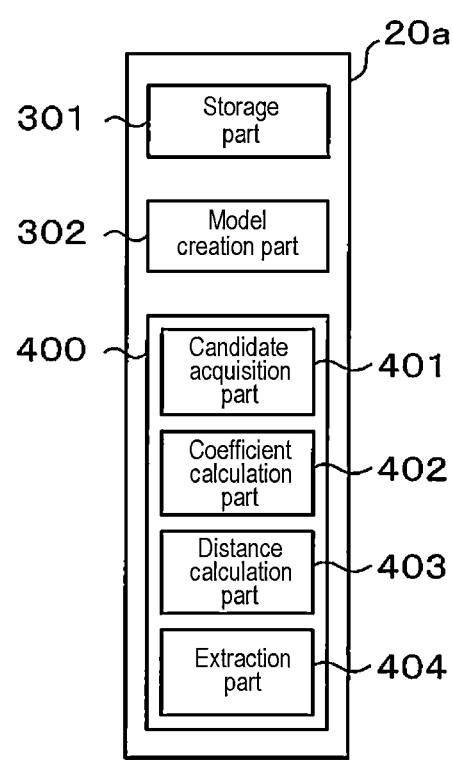
FIG. 14 is a block diagram showing an outline of another example of the overall control device.

FIG. 14 is a block diagram showing an outline of another example of the overall control device, and shows the configuration of substrate inspection. An overall control device 20a of FIG. 14 includes a storage part 301 and a model creation part 302, similarly to the overall control device 20 of FIG. 7. The overall control device 20a further includes a selection part 400 that selects a plurality of captured image sets used for creating an image estimation model by the model creating part 302, that is, a plurality of captured image sets for model creation, from a large number of captured image sets. The captured image set is an image set composed of a combination of a captured image before being processed by the substrate processing system 10 and a captured image after being processed by the substrate processing system 10 for a certain wafer W.

The selection part 400 determines a degree of abnormality for each captured image set and selects a captured image set for model creation based on the degree of abnormality. The degree of abnormality is determined by using the distribution of correlation between the in-plane tendency of a pixel value in a captured image of the wafer W before a desired process (hereinafter sometimes referred to as an "IN image") in the substrate processing system 10 and the in-plane tendency of a pixel value in a captured image of the wafer W after the desired process (hereinafter sometimes referred to as an "OUT image") in the substrate processing system 10.

The selection part 400 includes, for example, a candidate acquisition part 401, a coefficient calculation part 402, a distance calculation part 403, and an extraction part 404.

The candidate acquisition part 401 acquires a plurality of captured image sets from the storage part 301, as candidates for the captured image set for model creation.

For each captured image of the wafer W included in the captured image sets acquired by the candidate acquisition part 401, the coefficient calculation part 402 uses a Zernike polynomial to resolve a plane distribution of pixel values in the captured image into in-plane tendency components of a plurality of pixel values and calculate a Zernike coefficient of each in-plane tendency component.

The captured image of the wafer W is generally composed of three primary colors of RGB (Red, Green, and Blue). Therefore, an in-plane tendency component Zi of a pixel value can be obtained for each of the primary colors R, G, and B, but there is no difference in the image processing method between R, G, and B. Therefore, it is assumed below that all the primary colors R, G, and B are processed in parallel even if not specified.

Figure 15:
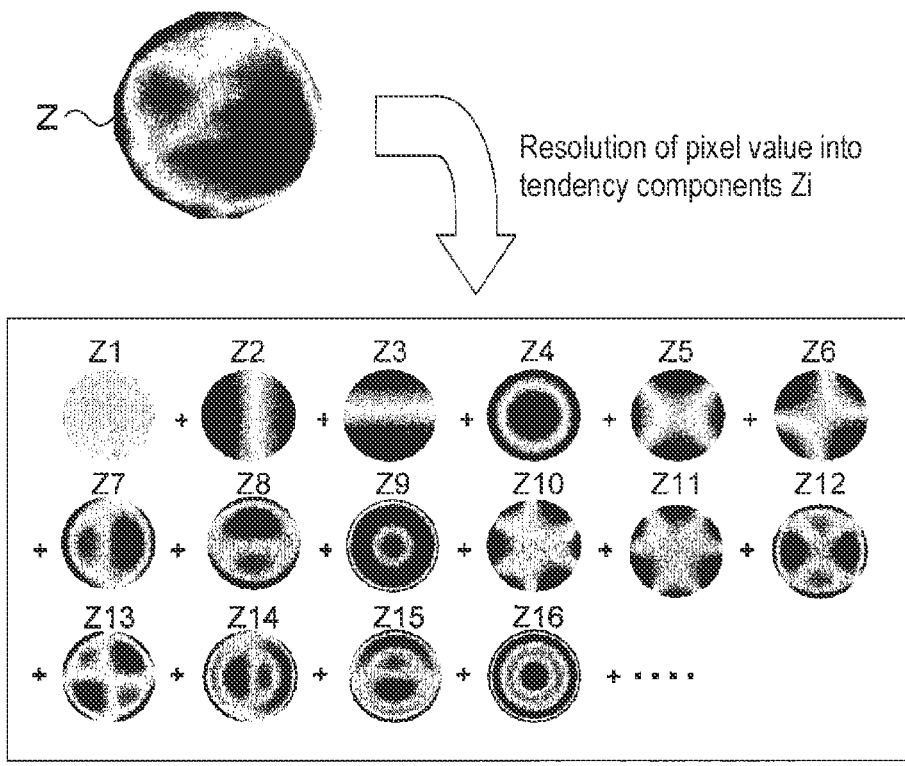
FIG. 15 is an explanatory view showing a state in which a Zernike polynomial is used to resolve a plane distribution of pixel values into in-plane tendency components of a plurality of pixel values.

For each captured image of the wafer W included in the captured image sets acquired by the candidate acquisition part 401, the coefficient calculation part 402 first digitizes the color of the captured image as a pixel value, for example, in the unit of a pixel, over the entire surface of the wafer W. As a result, a plane distribution of pixel values in the plane of the wafer is obtained. Then, the coefficient calculation part 402 resolves the plane distribution of pixel values in the plane of the wafer into in-plane tendency components Zi (i is an integer of 1 or more) of a plurality of pixel values. As shown in FIG. 15, the in-plane tendency components Zi of the plurality of pixel values is represented by using the Zernike polynomial to resolve the plane distribution Z of pixel values in the plane of the wafer into a plurality of components.

Next, the Zernike polynomial will be explained. The Zernike polynomial is a complex function mainly used in the field of optics and has two degrees (n, m). It is also a function on the unit circle with a radius of 1 and has polar coordinate arguments (r, θ). This Zernike polynomial is used in the field of optics, for example, to analyze an aberration component of a lens. The aberration component based on each independent wave front, for example, a shape such as a mountain shape or a saddle shape, can be known by using the Zernike polynomial to resolve a wave front aberration.

Figure 16:
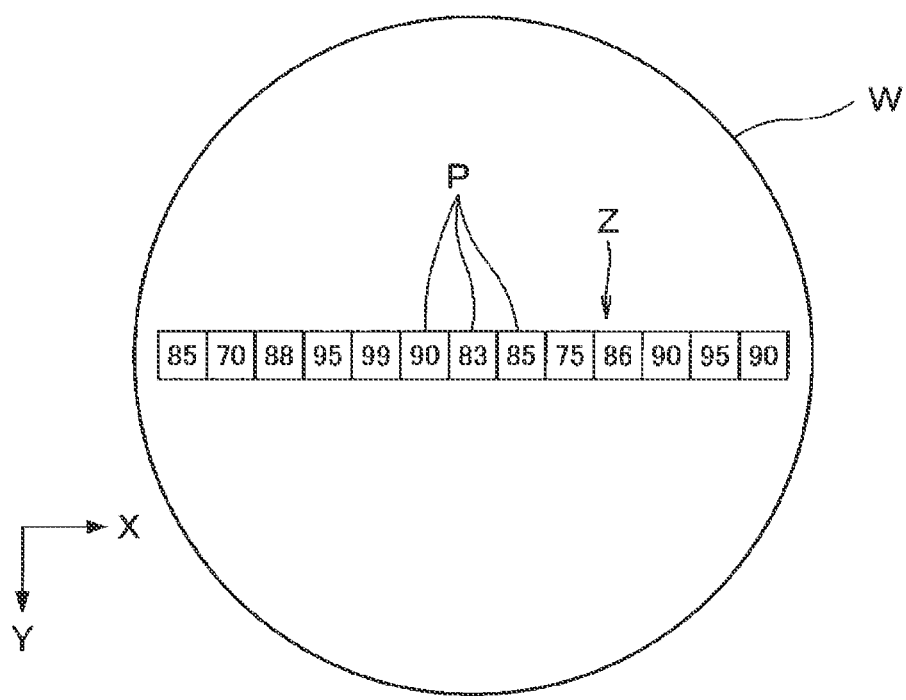
FIG. 16 is an explanatory view showing individual pixel values in a plane of the wafer.
Figure 17:
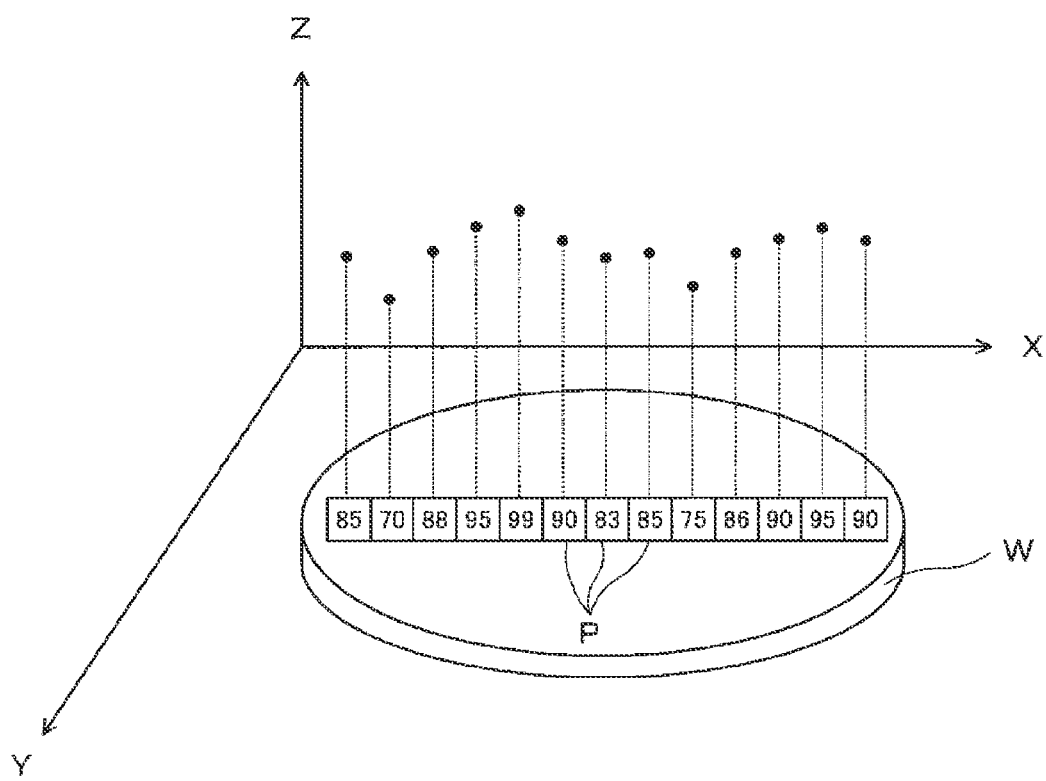
FIG. 17 is an explanatory view showing individual pixel values in the plane of the wafer in a height direction in the plane of the wafer.

Next, a method of obtaining the in-plane tendency components Zi of pixel values by using the Zernike polynomial in the present embodiment will be described with reference to FIGS. 16 and 17. FIG. 16 shows a plane distribution Z of pixel values of pixels P in the plane of the wafer W, where a numerical value described inside each pixel P indicates a pixel value of the pixel P. For the purpose of easy explanation, only one row of pixels P along the X-axis direction is shown in FIGS. 16 and 17. When applying the Zernike polynomial to the plane distribution Z of pixel values shown in FIG. 16, the pixel value of each pixel P is shown in the height direction (the positive Z direction in FIG. 17) on the plane of the wafer W, for example, as shown in FIG. 17. As a result, the plane distribution of pixel values of the pixels P can be understood as a curve having a predetermined shape drawn in three dimensions. Then, by expressing the pixel values of all the pixels P in the plane of the wafer W in the height direction on the plane of the wafer W in the same manner, the distribution of pixel values in the plane of the wafer W can be understood as a wave front having a three-dimensional circular shape. By understanding the distribution of pixel values in the plane of the wafer W as the three-dimensional wave front in this way, the Zernike polynomial can be applied to resolve the plane distribution Z of pixel values in the plane of the wafer into the in-plane tendency components Zi of a plurality of pixel values, such as an inclination component in the vertical and horizontal directions in the plane of the wafer or a curved component that curves in a convex shape or a concave shape. The magnitude of each of the in-plane tendency components Zi of the pixel values can be expressed by the Zernike coefficient.

The Zernike coefficient expressing the in-plane tendency components Zi of the pixel values is specifically expressed by using the polar coordinate arguments (r, θ) and the degrees (n, m). The Zernike coefficients from the first term to the ninth term are shown below as an example.

$$Z1, n = 0, m = 0 (1)$$

$$Z2, n = 1, m = 1 (r \cdot \cos\theta)$$

$$Z3, n = 0, m = -1 (r \cdot \sin\theta)$$

$$Z4, n = 2, m = 0 (2r^2 - 1)$$

$$Z5, n = 2, m = 2 (r^2 \cdot \cos 2\theta)$$

$$Z6, n = 2, m = -2 (r^2 \cdot \sin 2\theta)$$

$$Z7, n = 3, m = 1 ((3r^2 - 2r) \cdot \cos\theta)$$

-continued $$Z8, n = 3, m = -1((3r^2 - 2r) - \sin\theta)$$

$$Z9, n = 4, m = 0(6r^2 - 6r + 1)$$

...

For example, the Zernike coefficient Z1, which is the first item of the Zernike coefficients, means an average value of pixel values in the plane of the wafer, the second Zernike coefficient Z2 means an inclination component of a pixel value in the plane of the wafer in the horizontal direction, the third Zernike coefficient Z3 means an inclination component of the pixel value in the plane of the wafer in the front-back direction (the direction orthogonal to the inclination direction of the Zernike coefficient Z2), and the fourth Zernike coefficient means a curved component of the pixel value that is uniform in the circumferential direction with the center of the wafer as the origin and gradually increases in the radial direction.

The following is a description of FIG. 14. The coefficient calculation part 402 calculates the values of the in-plane tendency components Zi of the pixel values obtained by resolving the plane distribution Z of the pixel values in the plane of the wafer as described above. Specifically, since the magnitude of each of the in-plane tendency components Zi of the pixel values is expressed by the Zernike coefficients as described above, the value of each of the in-plane tendency components Zi of the pixel values is calculated by obtaining the value of each Zernike coefficient.

Based on the correlation distribution between the Zernike coefficient in the IN image and the Zernike coefficient in the OUT image for each term (for each degree) in the Zernike polynomial, the distance calculation part 403 calculates a Mahalanobis distance for each of the captured image sets by the candidate acquisition part 401. For each of the captured image sets acquired by the candidate acquisition part 401, the distance calculation part 403 calculates the Mahalanobis distance MD (see FIG. 19 to be described later) between a point indicating the captured image set and the correlation distribution in a space to which the correlation distribution belongs (that is, a distribution space consisting of the Zernike coefficient in the IN image and the Zernike coefficient in the OUT image) for each term in the Zernike polynomial.

The extraction part 404 determines the degree of abnormality for each of the captured image sets acquired by the candidate acquisition part 401, based on the Mahalanobis distance calculated by the distance calculation part 403. Then, the extraction part 404 extracts and selects a captured image set for model creation from the captured image sets acquired by the candidate acquisition part 401, based on the determined degree of abnormality.

Figure 18:
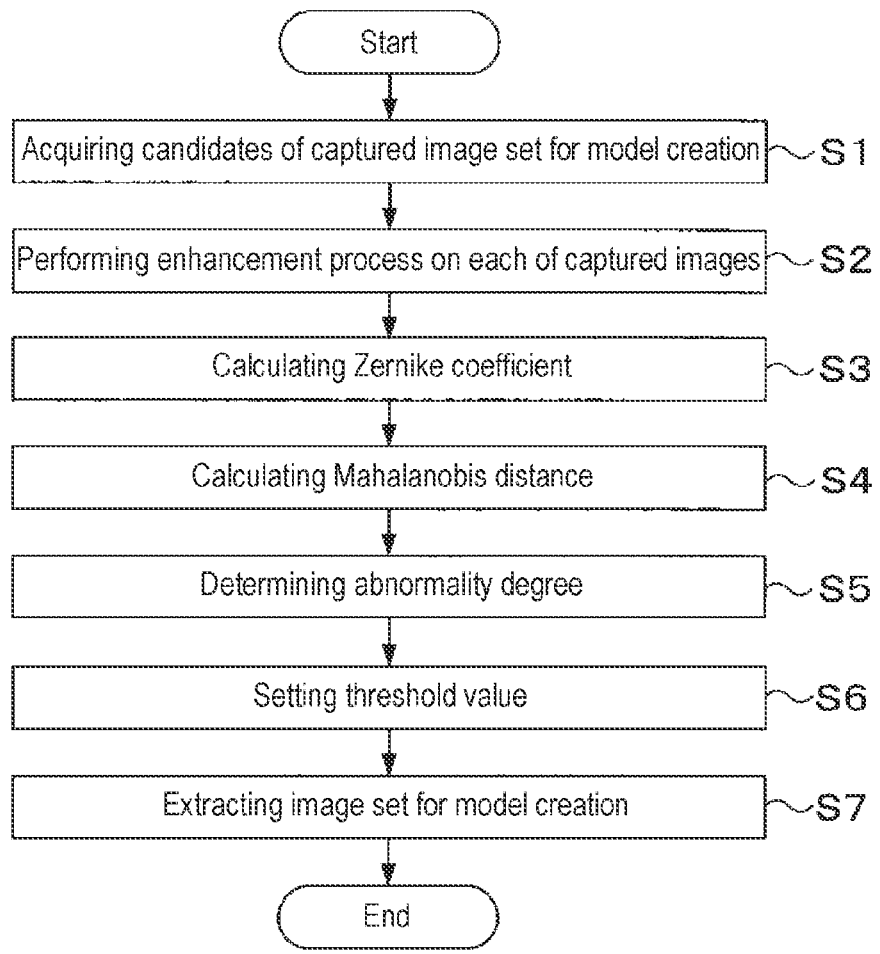
FIG. 18 is a view showing a flow of selection process of a captured image set for model creation by a selection part.
Figure 19:
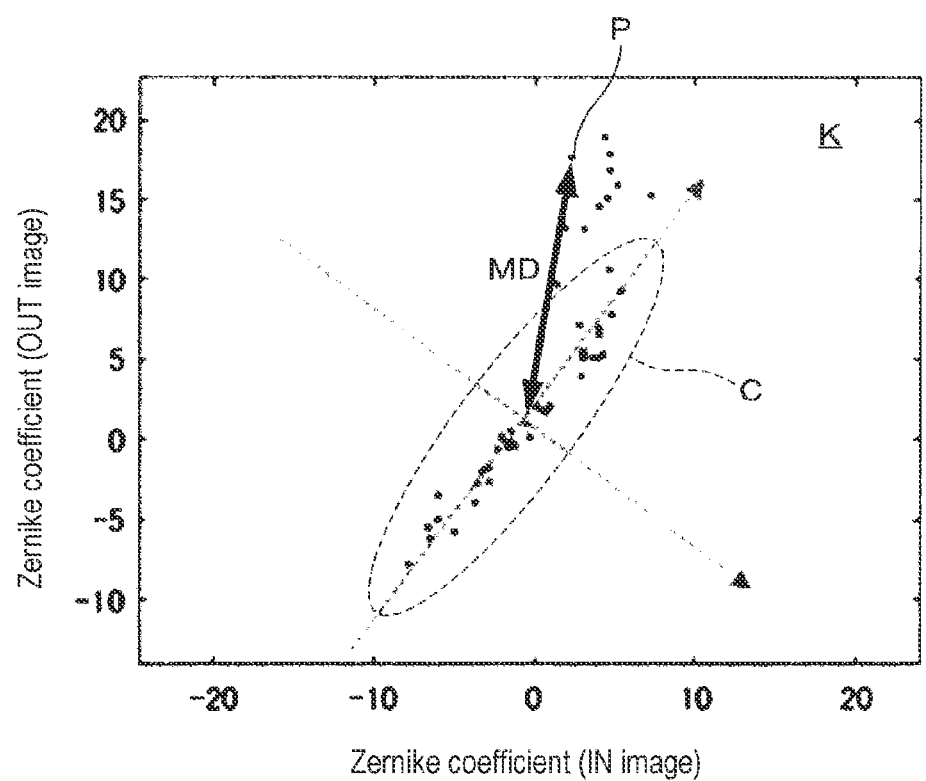
FIG. 19 is a view for explaining a Mahalanobis distance.
Figure 20:
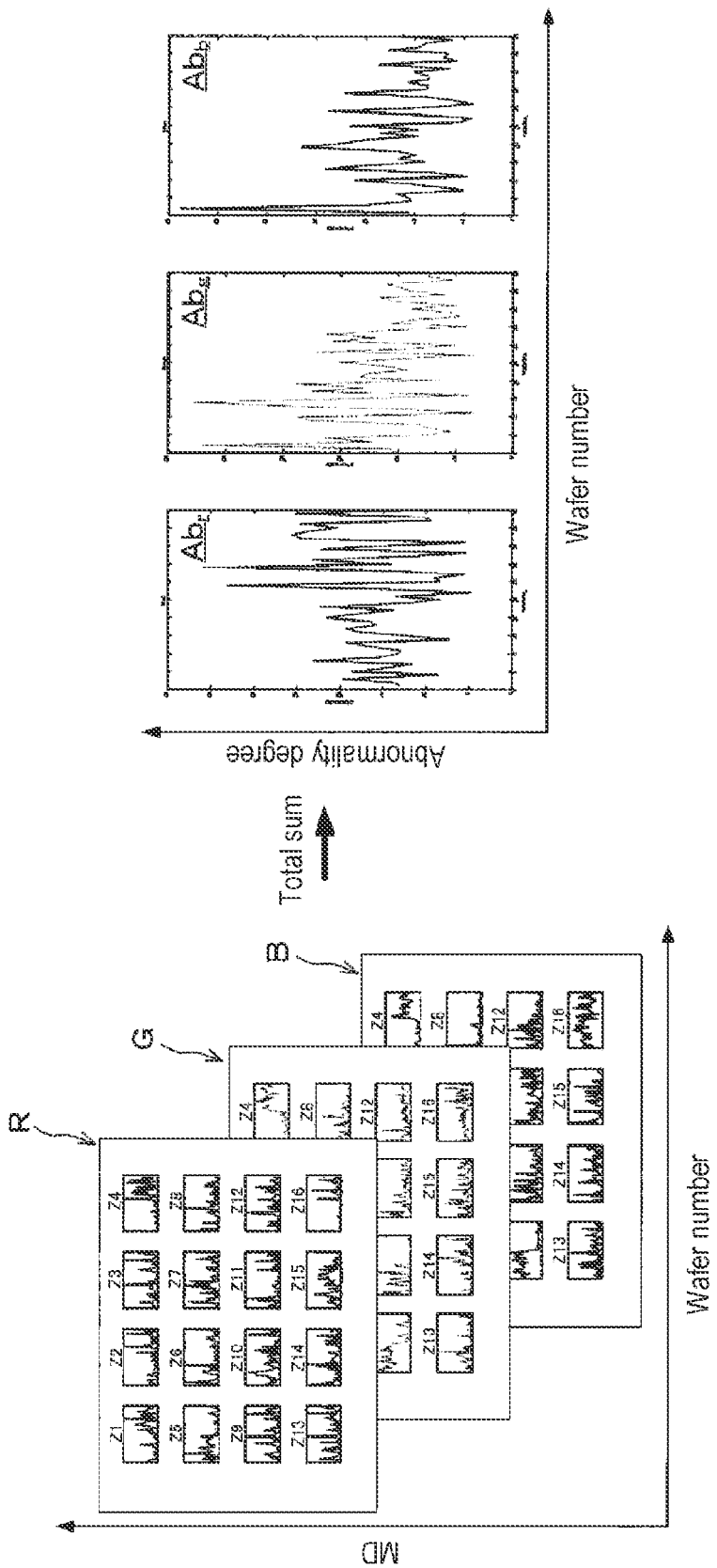
FIG. 20 is a view conceptually showing a method of calculating a degree of abnormality.

Next, a selection process of the captured image set for model creation by the selection part 400 will be described. FIG. 18 is a view showing a flow of the selection process of the captured image set for model creation by the selection part 400. FIG. 19 is a view for explaining the Mahalanobis distance. FIG. 20 is a view conceptually showing a method of calculating the degree of abnormality.

First, as shown, the candidate acquisition part 401 of the selection part 400 acquires a plurality of captured image sets from the storage part 301, as candidates for the captured image set for model creation (step S1). At that time, the candidate acquisition part 401 excludes captured image sets for the wafer W, which has been determined to be "defective" in the defect inspection, from the candidates for the captured image set for model creation. The candidate acquisition part 401 excludes captured image sets for the wafer W, which has been determined to be "defective," both in the case where the captured image sets have been determined to be "defective" in the defect inspection based on the IN image and in the case where the captured image sets have been determined to be "defective" in the defect inspection based on the OUT image.

Subsequently, the coefficient calculation part 402 performs an enhancement process on each of the captured images (that is, the IN image and the OUT image) included in the captured image sets acquired by the candidate acquisition part 401 (step S2). The enhancement process is, for example, a process for enhancing contrast in each captured image. This process makes it possible to make potential coating unevenness apparent for a captured image of a wafer on which a coating film is formed.

Subsequently, for each of the enhanced captured images of the wafer W, the coefficient calculation part 402 resolves the plane distribution of the pixel values in the captured image into the in-plane tendency components Zi of a plurality of pixel values by using the Zernike polynomial, and calculates the Zernike coefficient of each of the in-plane tendency components (step S3). In other words, for each of the enhanced captured images of the wafer W (that is, for each of the enhanced IN image and OUT image), the coefficient calculation part 402 uses the Zernike polynomial to approximate the plane distribution of the pixel values in the images, and calculates the coefficient of each term in the approximation formula, that is, the Zernike coefficients. The coefficient calculation part 402 calculates, for example, the Zernike coefficients from the first term to the sixteenth term in the Zernike polynomial. The calculation of the Zernike coefficients as described above by the coefficient calculation part 402 is performed for each of RGB components, for example.

Subsequently, for each of the captured image sets acquired by the candidate acquisition part 401, the distance calculation part 403 calculates the Mahalanobis distance MD for each term in the Zernike polynomial (step S4). As shown in FIG. 19, the Mahalanobis distance MD calculated here for each term in the Zernike polynomial is a Mahalanobis distance between a point P indicating a captured image set to be calculated and a correlation distribution C between the Zernike coefficient in the IN image and the Zernike coefficient in the OUT image, in a distribution space K of Zernike coefficients between the IN image and the OUT image. Also, the Mahalanobis distance represents a measure between a sample point and a distribution. The Mahalanobis distance MD from a vector y to a distribution having a mean μ and a covariance Σ can be calculated by the following equation.

$$MD = \sqrt{(y - \mu)\Sigma^{-1}(y - \mu)'} \quad \text{[Eq. 1]}$$

For each of the first to sixteenth terms in the Zernike polynomial, the distance calculation part 403 calculates the Mahalanobis distance MD of each of the captured image sets acquired by the candidate acquisition part 401. Also, the Mahalanobis distance for each term in the Zernike polynomial is calculated for each of RGB, for example. Further, the Mahalanobis distance calculated for each term in the Zernike polynomial may be normalized by dividing the Mahalanobis distance by the average value in the corresponding term.

Subsequently, the extraction part 404 determines a degree of abnormality Ab of each captured image set based on the Mahalanobis distance calculated for each term in the Zernike polynomial by the distance calculation part 403 for each captured image set (step S5). For example, the extraction part 404 determines a degree of abnormality Ab by adding the Mahalanobis distance MD calculated for each term in the Zernike polynomial by the distance calculation part 403 for each captured image set.

More specifically, for example, as shown in FIG. 20, the extraction part 404 adds all the Mahalanobis distances MD for R, which are calculated by the distance calculation part 403 for each of the first to sixteenth terms in the Zernike polynomial, for each captured image set. Then, the extraction part 404 determines a result of the addition (that is, a sum of the Mahalanobis distances MD) as the degree of abnormality $Ab_r$ for R of each captured image set. Similarly, for example, the extraction part 404 adds all the Mahalanobis distances MD for G, which are calculated by the distance calculation part 403 for each of the first to sixteenth terms in the Zernike polynomial, for each captured image set, and determines a result of the addition as the degree of abnormality $Ab_g$ for G of each captured image set. Further, for example, the extraction part 404 adds all the Mahalanobis distances MD for B, which are calculated by the distance calculation part 403 for each of the first to sixteenth terms in the Zernike polynomial, for each captured image set, and determines a result of the addition as a degree of abnormality $Ab_b$ for B of each captured image set. That is, for each of the RGB colors and for each captured image set, the extraction part 404 adds all the Mahalanobis distances MD calculated for each of the first to sixteenth terms in the Zernike polynomial and for each of the RGB colors.

Further, for each captured image set, when the distance calculation part 403 adds the Mahalanobis distances MD calculated for each term in the Zernike polynomial, weighting may be performed for each term in the Zernike polynomial. Further, for each captured image set, when the distance calculation part 403 adds the Mahalanobis distances calculated for each term in the Zernike polynomial and for each of the RGB colors, weighting may be performed for each color.

Subsequently, the extraction part 404 sets an abnormality determination threshold value Th for the abnormality degree Ab determined by the extraction part 404 (step S6). For example, the extraction part 404 calculates a threshold value $Th_c$ based on the equation below. In the equation below, $Ab_{Ave}$ indicates the average value of the abnormality degree Ab determined by the extraction part 404, $Ab_{Std}$ indicates the standard deviation of the abnormality degree Ab determined by the extraction part 404, and c is, for example, an integer of 1 to 3.

$$Th_c = Ab_{Ave} + c \times Ab_{Std}$$

The extraction part 404 sets the calculated threshold value $Th_c$ as the abnormality determination threshold value Th. When the threshold value $Th_c$ that has been calculated and set is too small, more than necessary captured image sets may be excluded from the captured image set for model creation in a captured image set extraction step for model creation in step S7 to be described later. Therefore, a lower limit value of the abnormality determination threshold value Th may be provided, and when the threshold value $Th_c$ calculated based on the above equation is smaller than the lower limit value, the lower limit value may be set as the abnormality determination threshold value Th. The calculation of the threshold value $Th_c$ based on the above equation and the setting of the abnormality determination threshold value Th are performed for each of RGB. In the following, the abnormality determination threshold values Th for R, G, and B are set to $Th_r$, $Th_g$, and $Th_b$, respectively.

Then, the extraction part 404 extracts and selects a captured image set for model creation based on the abnormality degree Ab of each of the captured image sets determined by the extraction part 404 and the threshold value Th set by the extraction part 404 (step S7). Specifically, the extraction part 404 extracts a captured image set in which the abnormality degree Ab to which the Mahalanobis distances MD are added does not exceed the abnormality determination threshold value Th, among the captured image sets acquired by the candidate acquisition part 401, as the captured image set for model creation. More specifically, the extraction part 404 extracts a captured image set that satisfies all of the conditions (x1) to (x3) below, as the captured image set for model creation.

(x1) Abnormality degree $Ab_r$ for R≥abnormality determination threshold value $Th_r$ for R (x2) Abnormality degree $Ab_g$ for G≥abnormality determination threshold value $Th_g$ for G (x3) Abnormality degree $Ab_b$ for B≥abnormality determination threshold value $Th_b$ for B As described above, by automatically selecting the optimal image set for learning the image estimation model from a large number of captured image sets, it is possible to ensure the quality of the image estimation model and further improve the accuracy of defect detection using this image estimation model.

The method of extracting the captured image set for model creation based on the Mahalanobis distance by the extraction part 404 is not limited to the above example. For example, the method may be as described below.

That is, for example, the extraction part 404 sets the Mahalanobis distance MD, which is calculated by the distance calculation part 403 for each term in the Zernike polynomial, as the abnormality degree Ab, for each captured image set. More specifically, for example, the extraction part 404 sets the Mahalanobis distances MD for R, which are calculated by the distance calculation part 403 for the first to sixteenth terms in the Zernike polynomial, as abnormality degrees $Ab_{r1}$ to $Abr_{r16}$ for R of each captured image set. Similarly, for example, the extraction part 404 sets the Mahalanobis distances MD for G, which are calculated by the distance calculation part 403 for the first to sixteenth terms in the Zernike polynomial, as abnormality degrees $Ab_{r1}$ to $Abr_{g16}$ for G of each captured image set. Further, for example, the extraction part 404 sets the Mahalanobis distances MD for B, which are calculated by the distance calculation part 403 for the first to sixteenth terms in the Zernike polynomial, as abnormality degrees $Ab_{b1}$ to $Abr_{b16}$ for B of each captured image set.

Then, the extraction part 404 sets an abnormality determination threshold value Th for each term in the Zernike polynomial with respect to the abnormality degree Ab set by the extraction part 404. For example, the extraction part 404 calculates a threshold value $Th_c$ for each of the first to sixteenth terms in the Zernike polynomial. In this case, for example, the same equation as described above can be used for a calculation equation.

The extraction part 404 sets the calculated threshold value $Th_c$ as the abnormality determination threshold value Th for each of the first to sixteenth terms in the Zernike polynomial. In the case of this example as well, a lower limit value of the abnormality determination threshold value Th may be provided as described above. The calculation of the threshold value $Th_c$ and the setting of the abnormality determination threshold value Th are performed for each of RGB. In the following, for each of the first to sixteenth terms in the Zernike polynomial, the abnormality determination threshold values Th for R are set to $Th_{r1}$ to $Th_{r16}$, the abnormality determination threshold values Th for G are set to $Th_{g1}$ to $Th_{g16}$, and the abnormality determination threshold values Th for B are set to $Th_{b1}$ to $Th_{b16}$.

Then, the extraction part 404 extracts a captured image set having no term (degree) in the Zernike polynomial in which the abnormality degree Ab exceeds the abnormality determination threshold value Th, among the captured image sets acquired by the candidate acquisition part 401, as the captured image set for model creation. More specifically, when n is an integer of 1 to 16, the extraction part 404 extracts a captured image set that satisfies all of the conditions (y1) to (y3) below, as the captured image set for model creation.

(y1) For the n-th term in the Zernike polynomial, abnormality degree $Ab_{rn} \geq$ threshold value $Th_{rn}$.

(y2) For the n-th term in the Zernike polynomial, abnormality degree $Ab_{gn} \geq$ threshold value $Th_g n$.

(y3) For the n-th term in the Zernike polynomial, abnormality degree $Ab_{bn} \geq$ threshold value $Th_{bn}$.

In the above example, the Mahalanobis distance is calculated for all colors and all terms in all Zernike polynomials, but the calculation of the Mahalanobis distance may be omitted for some colors and some terms. Information about the colors and items that omit calculation of the Mahalanobis distance are stored in the storage part 301 in advance.

Figure 21:
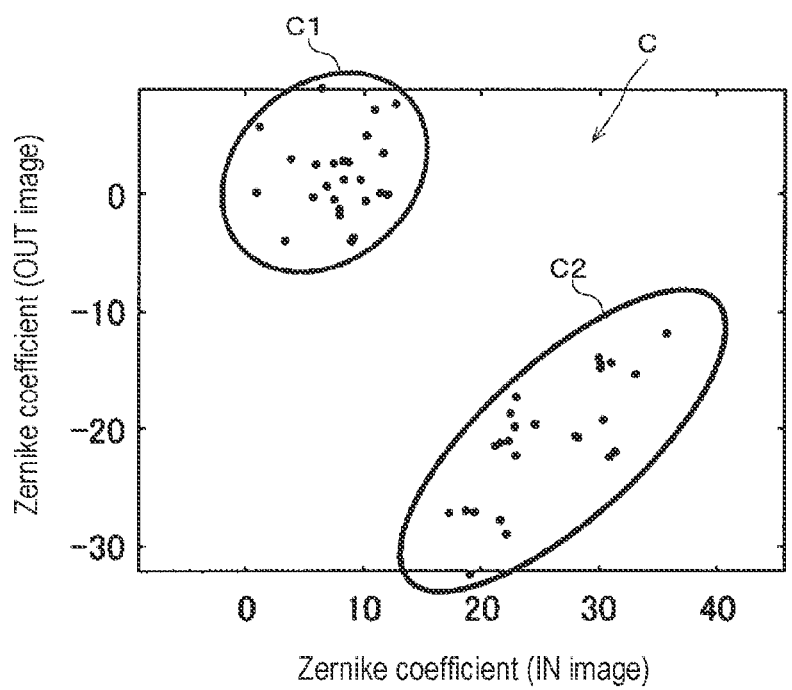
FIG. 21 is a view for explaining another example of a method of calculating the Mahalanobis distance.

FIG. 21 is a view for explaining another example of the method of calculating the Mahalanobis distance. As shown in FIG. 21, there may be a case in which when the correlation distribution C between the Zernike coefficient in the IN image and the Zernike coefficient in the OUT image is not integrated, an appropriate Mahalanobis distance cannot be calculated so that a captured image set for model creation cannot be selected appropriately. In this case, the correlation distribution C may be divided into a plurality of sub-correlation distributions. For example, the correlation distribution C may be divided into two sub-correlation distributions C1 and C2 as shown in FIG. 21. Then, when the distance calculation part 403 calculates the Mahalanobis distance of a captured image set, the Mahalanobis distance between a sub-correlation distribution to which the captured image set belongs and a point indicating the captured image set may be calculated.

The unit of division of the correlation distribution C into the sub-correlation distributions is, for example, for each lot of the wafer W, for each apparatus, or for each transfer route, that is, for each passage module.

The embodiments disclosed herein should be considered to be illustrative in all respects and not restrictive. The above embodiments may be omitted, replaced, or modified in various forms without departing from the appended claims and the gist thereof.

The following configurations also belong to the technical scope of the present disclosure.

(1) A substrate inspection apparatus for inspecting a substrate, including:

an acquisition part configured to acquire an estimated image of an inspection target substrate after a process by a substrate processing apparatus, based on an image estimation model created by machine learning by using a captured image before the process by the substrate processing apparatus and a captured image after the process by the substrate processing apparatus for each of a plurality of substrates, and a captured image of the inspection target substrate before the process by the substrate processing apparatus; and a determination part configured to determine presence or absence of a defect in the inspection target substrate, based on the captured image of the inspection target substrate and the estimated image of the inspection target substrate after the process by the substrate processing apparatus.

In (1) above, the image estimation model created by machine learning by using the captured images before and after the process for the plurality of substrates is used to generate a reference image which serves as a reference for defect inspection, and it is determined the presence or absence of the defect in the inspection target substrate. Since the reference image serving as the reference for defect inspection is the estimated image generated based on the image estimation model, the unevennesses of the captured image and the reference image for the inspection target substrate after the process becomes substantially the same. Therefore, since it is unlikely that unevenness is detected as a defect, it is possible to improve the defect detection accuracy.

(2) The substrate inspection apparatus of (1) above, wherein the image estimation model generates the estimated image of the inspection target substrate after the process by the substrate processing apparatus.

(3) The substrate inspection apparatus of (1) above, wherein the determination part determines the presence of absence of the defect in the inspection target substrate, based on a difference between the capture image of the inspection target substrate and the estimated image of the inspection target substrate after the process by the substrate processing apparatus.

(4) The substrate inspection apparatus of (1) above, wherein the determination part determines the presence or absence of the defect in the inspection target substrate, based on images of substrate center portions of the capture image of the inspection target substrate and the estimated image of the inspection target substrate after the process by the substrate processing apparatus.

(5) The substrate inspection apparatus of (1) above, wherein the image estimation model is a generation network that converts an input arbitrary image to generate a fake image in a conditional generative adversarial network, wherein in the conditional generative adversarial network, for an identification network that receives a real image corresponding to the arbitrary image and obtained by capturing performed after the process by the substrate processing apparatus, or the estimated image generated based on the arbitrary image, together with the arbitrary image, and identifies whether the image received together with the arbitrary image is the captured image or the estimated image, and identification method is machine-learned so as to accurately perform the identification, and wherein for the generation network, and image conversion method is machine-learned so as to recognize the estimated image as the capture image in the identification network.

(6):

The substrate inspection apparatus of (1) above, further comprising: a creation part configured to create an image estimation model by machine learning by using a captured image before a process by the substrate processing apparatus and a captured image after the process by the substrate processing apparatus for each of the plurality of substrates.

(7) The substrate inspection apparatus of (6) above, further comprising: a selection part configured to select an image set for model creation, which is captured image set composed of a combination of a captured image of a substrate before the process and a captured image of the substrate after the process, wherein the selection part is configured to select the captured image set for model creation based on a degree of abnormality determined by using a correlation distribution between in-plane tendency of a pixel value in the captured image of the substrate before the process and in-plane tendency of a pixel value in the captured image of the substrate after the process.

(8) The substrate inspection apparatus of (7) above, wherein the selection part includes: a candidate acquisition part configured to acquire a plurality of captured image sets as candidates for the captured image set for model creation; a coefficient calculation part configured to resolve a plane distribution of pixel values in each of the captured images of the substrate included in the acquired captured image set into in-plane tendency components of plurality of pixel values by using a Zernike polynomial and calculate a Zemike coefficient of each of the in-plane tendency components; a distance calculation part configured to calculate a Mahalanobis distance of each of the captured image sets for each term in the Zernike polynomial, based on a correlation distribution between a Zernike coefficient in the captured image of the substrate before the process and a Zernike coefficient in the captured image of the substrate after the process; and an extraction part configured to determine the degree of abnormality based on the Mahalanobis distance for each of the captured image sets and extract the captured image set for model creation based on the degree of abnormality among the captured image sets acquired by the candidate acquisition part.

(9) The substrate inspection apparatus of (8) above, wherein the extraction part is configured to determine the degree of abnormality for each of the captured image sets by adding the Mahalanobis distance calculated for each term in the Zernike polynomial by the distance calculation part and extract a captured image set in which the degree of abnormality obtained by adding the Mahalanobis distance does not exceed a threshold value, among the captured image sets acquired by the candidate acquisition part, as the captured image set for model creation.

(10) The substrate inspection apparatus of (8) above, wherein the degree of abnormality is the Mahalanobis distance calculated by the distance calculation part for each term in the Zernike polynomial, and wherein the extraction part is configured to extract a captured image set having no term in the Zernike polynomial in which the degree of abnormality exceeds the threshold value, among the captured image sets, as the captured image set for model creation.

(11) A substrate inspection system includes: the substrate inspection apparatus of (1) above; and a substrate processing apparatus configured to process a substrate.

(12) A substrate inspection method of inspecting a substrate, includes: acquiring an estimated image of the inspection target substrate after the process by the substrate processing apparatus, based on an image estimation model created by machine learning by using the captured image before the process by the substrate processing apparatus and captured image after the process by the substrate processing apparatus for each of a plurality of substrates, and the captured image of the inspection target substrate before the process by the substrate processing apparatus; and determining presence of absence of a defect in the inspection target substrate, based on the captured image of the inspection target substrate after the process by the substrate processing apparatus, and the estimated image.

(13) The substrate inspection method of (12) above, wherein the image estimation model generates the estimated image of the inspection target substrate after the process by the substrate processing apparatus.

(14) The substrate inspection method of (12) above, wherein the determining the presence or absence of the defect in the inspection target substrate determines the presence or absence of the defect in the inspection target substrate and the estimated image of the inspection target substrate after the process by the substrate processing apparatus.

(15) The substrate inspection method of (12) above, wherein the determining the presence or absence of the defect in the inspection target substrate determines the presence or absence of the defect in the inspection target substrate, based on images of substrate center portions of the captured image of the inspection target substrate and the estimated image of the inspection target substrate after the process by the substrate processing apparatus.

(16) The substrate inspection method of (12) above, further includes: creating an image estimation model by machine learning by using a captured image before the process by the substrate processing apparatus and a captured image after the process by the substrate processing apparatus for each of a plurality of substrates, and a captured image of the inspection target substrate before the process by the substrate processing apparatus

(17) The substrate inspection method of (16) above, further includes: selecting an image set for model creation, which is a captured image set composed of a combination of a captured image of a substrate before the process and a captured image of the substrate after the process, wherein the selecting the image set for model creation selects the captured image set for model creation based on a degree of abnormality determined by using a correlation distribution between in-plane tendency of a pixel value in the captured image of the substrate before the process and in-plane tendency of a pixel value in the captured image of the substrate after the process.

(18) The substrate inspection method of (17) above, wherein the selecting the image set for model creation includes: acquiring a plurality of captured image sets as candidates for the captured image set for model creation; resolving a plane distribution of pixel values in each of the captured images of the substrate included in the acquired captured image set into in-plane tendency components of a plurality of pixel values by using a Zernike polynomial and calculating a Zernike coefficient of each of the in-plane tendency components; calculating a Mahalanobis distance of each of the captured image sets for each term in the Zernike polynomial, based on a correlation distribution between a Zernike coefficient in the captured image of the substrate before the process and a Zernike coefficient in the captured image of the substrate after the process; and determining the degree of abnormality based on the Mahalanobis distance for each of the captured image sets and extracting the captured image set for model creation based on the degree of abnormality among the captured image sets acquired by the candidate acquisition part.

(19) A non-transitory computer-readable recording medium recording a computer program for causing a computer to execute a process of inspecting a substrate, wherein the process includes acquiring an estimated image of an inspection target substrate after the process by a substrate processing apparatus, based on an image estimation model created by machine learning by using a captured image before the process by the substrate processing apparatus and a captured image after the process by the substrate processing apparatus for each of a plurality of substrates, and a captured image of the inspection target substrate before the process by the substrate processing apparatus; and determining presence or absence of a defect in the inspection target substrate, based on the captured image of the inspection target substrate and the estimated image of the inspection target substrate after the process by the substrate processing apparatus.

EXPLANATION OF REFERENCE NUMERALS

1: substrate inspection system, 20: overall control device, 120: development processing apparatus, 121: underlayer film forming apparatus, 122: intermediate layer film forming apparatus, 123: resist coating apparatus, 130: heat treatment apparatus, 251: capturing control device, 302: model creation part, 313: estimated-image acquisition part, 314: determination part, Ie: estimated image, Ip: captured image, K1, K2, K3: defect, W: wafer

What is claimed is:

1. A substrate inspection apparatus for inspecting a substrate, comprising:
   a first control circuit; and
   a second control circuit that is associated with a substrate inspection along with the first control circuit,
   wherein the first control circuit is configured to:
      acquire an estimated image of an inspection target substrate after a process by a substrate processing apparatus, based on an image estimation model created by machine learning by using a captured image before the process by the substrate processing apparatus and a captured image after the process by the substrate processing apparatus for each of a plurality of substrates, and a captured image of the inspection target substrate before the process by the substrate processing apparatus; and
      determine presence or absence of a defect in the inspection target substrate, based on the captured image of the inspection target substrate after the process by the substrate processing apparatus and the estimated image of the inspection target substrate after the process by the substrate processing apparatus,
   wherein the second control circuit is configured to:
      create an image estimation model by machine learning by using the captured image before the process by the substrate processing apparatus and the captured image after the process by the substrate processing apparatus for each of the plurality of substrates; and
      select an image set for model creation, which is a captured image set composed of a combination of the captured image before the process and the captured image after the process for each of the plurality of substrate, and
   wherein the second control circuit is further configured to select the captured image set for model creation based on a degree of abnormality determined by using a correlation distribution between in-plane tendency of a pixel value in the captured image before the process and in-plane tendency of a pixel value in the captured image after the process.

2. The substrate inspection apparatus of claim 1 wherein the image estimation model generates the estimated image of the inspection target substrate after the process by the substrate processing apparatus.

3. The substrate inspection apparatus of claim 1, wherein the first control circuit determines the presence or absence of the defect in the inspection target substrate, based on a difference between the captured image of the inspection target substrate and the estimated image of the inspection target substrate after the process by the substrate processing apparatus.

4. The substrate inspection apparatus of claim 1, wherein the first control circuit determines the presence or absence of the defect in the inspection target substrate, based on images of substrate center portions of the captured image of the inspection target substrate and the estimated image of the inspection target substrate after the process by the substrate processing apparatus.

5. The substrate inspection apparatus of claim 1, wherein the image estimation model is a generation network that converts an input arbitrary image to generate the estimated image in a conditional generative adversarial network,
   wherein in the conditional generative adversarial network, for an identification network that receives a captured image corresponding to the arbitrary image and obtained by capturing performed after the process by the substrate processing apparatus, or the estimated image generated based on the arbitrary image, together with the arbitrary image, and identifies whether the image received together with the arbitrary image is the captured image corresponding to the arbitrary image or the estimated image, an identification method is machine-learned so as to accurately perform the identification, and
   wherein for the generation network, an image conversion method is machine-learned so as to recognize the estimated image as the captured image corresponding to the arbitrary image in the identification network.

6. The substrate inspection apparatus of claim 1, wherein the second control circuit is further configured to:
   acquire a plurality of captured image sets as candidates for the captured image set for model creation;
   resolve a plane distribution of pixel values in each of the captured images of the substrate included in the acquired captured image set into in-plane tendency components of a plurality of pixel values by using a Zernike polynomial and calculate a Zernike coefficient of each of the in-plane tendency components;
   calculate a Mahalanobis distance of each of the captured image sets for each term in the Zernike polynomial, based on a correlation distribution between a Zernike coefficient in the captured image of the substrate before the process and a Zernike coefficient in the captured image of the substrate after the process; and
   determine the degree of abnormality based on the Mahalanobis distance for each of the captured image sets and extract the captured image set for model creation based on the degree of abnormality among the captured image sets acquired by the acquiring the plurality of captured image sets as the candidates.

7. The substrate inspection apparatus of claim 6, wherein the second control circuit is further configured to determine the degree of abnormality for each of the captured image sets by adding the Mahalanobis distance calculated for each term in the Zernike polynomial by the calculating the Mahalanobis distance and extract a captured image set in which the degree of abnormality obtained by adding the Mahalanobis distance does not exceed a threshold value, among the captured image sets acquired by the acquiring the plurality of captured image sets as the candidates, as the captured image set for model creation.

8. The substrate inspection apparatus of claim 6, wherein the degree of abnormality is the Mahalanobis distance calculated by the second control circuit for each term in the Zernike polynomial, and
wherein the second control circuit is configured to extract a captured image set having no term in the Zernike polynomial in which the degree of abnormality exceeds the threshold value, among the captured image sets, as the captured image set for model creation.

9. A substrate inspection system, comprising:
the substrate inspection apparatus of claim 1; and
a substrate processing apparatus configured to process a substrate.

10. A substrate inspection method of inspecting a substrate, the method comprising:
acquiring an estimated image of an inspection target substrate after a process by a substrate processing apparatus, based on an image estimation model created by machine learning by using a captured image before the process by the substrate processing apparatus and a captured image after the process by the substrate processing apparatus for each of a plurality of substrates, and a captured image of the inspection target substrate before the process by the substrate processing apparatus;
determining presence or absence of a defect in the inspection target substrate, based on a captured image of the inspection target substrate after the process by the substrate processing apparatus, and the estimated image of the inspection target substrate after the process by the substrate processing apparatus;
creating an image estimation model by machine learning by using the captured image before the process by the substrate processing apparatus and the captured image after the process by the substrate processing apparatus for each of the plurality of substrates; and
selecting an image set for model creation, which is a captured image set composed of a combination of the captured image before the process and the captured image after the process for each of the plurality of substrate,
wherein the selecting the image set for model creation includes selecting the captured image set for model creation based on a degree of abnormality determined by using a correlation distribution between in-plane tendency of a pixel value in the captured image before the process and in-plane tendency of a pixel value in the captured image after the process.

11. The substrate inspection method of claim 10, wherein the image estimation model generates the estimated image of the inspection target substrate after the process by the substrate processing apparatus.

12. The substrate inspection method of claim 10, wherein the determining the presence or absence of the defect in the inspection target substrate determines the presence or absence of the defect in the inspection target substrate, based on a difference between the captured image of the inspection target substrate and the estimated image of the inspection target substrate after the process by the substrate processing apparatus.

13. The substrate inspection method of claim 10, wherein the determining the presence or absence of the defect in the inspection target substrate determines the presence or absence of the defect in the inspection target substrate, based on images of substrate center portions of the captured image of the inspection target substrate and the estimated image of the inspection target substrate after the process by the substrate processing apparatus.

14. The substrate inspection method of claim 10, wherein the selecting the image set for model creation further includes:
acquiring a plurality of captured image sets as candidates for the captured image set for model creation;
resolving a plane distribution of pixel values in each of the captured images of the substrate included in the acquired captured image set into in-plane tendency components of a plurality of pixel values by using a Zernike polynomial and calculating a Zernike coefficient of each of the in-plane tendency components;
calculating a Mahalanobis distance of each of the captured image sets for each term in the Zernike polynomial, based on a correlation distribution between a Zernike coefficient in the captured image of the substrate before the process and a Zernike coefficient in the captured image of the substrate after the process; and
determining the degree of abnormality based on the Mahalanobis distance for each of the captured image sets and extracting the captured image set for model creation based on the degree of abnormality among the captured image sets acquired by the acquiring the plurality of captured image sets as the candidates.

15. A non-transitory computer-readable recording medium recording a computer program for causing a computer to execute a process of inspecting a substrate,
wherein the process includes:
acquiring an estimated image of an inspection target substrate after the process by a substrate processing apparatus, based on an image estimation model created by machine learning by using a captured image before the process by the substrate processing apparatus and a captured image after the process by the substrate processing apparatus for each of a plurality of substrates, and a captured image of the inspection target substrate before the process by the substrate processing apparatus;
determining presence or absence of a defect in the inspection target substrate, based on the captured image of the inspection target substrate after the process by the substrate processing apparatus and the estimated image of the inspection target substrate after the process by the substrate processing apparatus;
creating an image estimation model by machine learning by using the captured image before the process by the substrate processing apparatus and the captured image after the process by the substrate processing apparatus for each of the plurality of substrates; and
selecting an image set for model creation, which is a captured image set composed of a combination of the captured image before the process and the captured image after the process for each of the plurality of substrate, and wherein the selecting the image set for model creation includes selecting the captured image set for model creation based on a degree of abnormality determined by using a correlation distribution between in-plane tendency of a pixel value in the captured image before the process and in-plane tendency of a pixel value in the captured image after the process.

* * * * *